United States Patent
Kircher et al.

(10) Patent No.: US 9,360,188 B2
(45) Date of Patent: Jun. 7, 2016

(54) REMOTE PHOSPHOR ELEMENT FILLED WITH TRANSPARENT MATERIAL AND METHOD FOR FORMING MULTISECTION OPTICAL ELEMENTS

(71) Applicant: CREE, INC., Durham, NC (US)

(72) Inventors: Deborah Kircher, Santa Barbara, CA (US); Theodore Lowes, Lompoc, CA (US); Paul T. Fini, Santa Barbara, CA (US); Bernd Keller, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/185,123

(22) Filed: Feb. 20, 2014

(65) Prior Publication Data

US 2015/0233544 A1    Aug. 20, 2015

(51) Int. Cl.
| | |
|---|---|
| H01L 33/50 | (2010.01) |
| F21V 9/16 | (2006.01) |
| F21K 99/00 | (2016.01) |
| H01L 33/64 | (2010.01) |
| F21V 29/502 | (2015.01) |

(52) U.S. Cl.
CPC ... *F21V 9/16* (2013.01); *F21K 9/56* (2013.01); *F21V 29/502* (2015.01); *H01L 33/644* (2013.01); *F21K 9/90* (2013.01); *H01L 33/507* (2013.01); *H01L 2933/0041* (2013.01)

(58) Field of Classification Search
CPC ........... F21V 9/16; F21V 29/502; F21K 9/56; H01L 33/644
See application file for complete search history.

(56) References Cited

U.S. PATENT DOCUMENTS

| | | | |
|---|---|---|---|
| 2,394,992 A | 2/1946 | Franck | 362/311.12 |
| 3,143,592 A | 8/1964 | William | 174/16.3 |
| 3,581,162 A | 5/1971 | Wheatley | 317/234 |
| 4,219,871 A | 8/1980 | Larrimore | 362/264 |
| 4,727,289 A | 2/1988 | Uchida | |
| 5,140,220 A | 8/1992 | Hasegawa | |

(Continued)

FOREIGN PATENT DOCUMENTS

| | | |
|---|---|---|
| CN | 1425117 | 6/2003 |
| CN | 1465106 A | 12/2003 |

(Continued)

OTHER PUBLICATIONS

Office Action from Japanese Patent Appl. No. 2014-122643, dated Apr. 10, 2015.

(Continued)

*Primary Examiner* — Long Pham
(74) *Attorney, Agent, or Firm* — Koppel, Patrick, Heybl & Philpott

(57) ABSTRACT

Lighting components and fixtures having optical elements with multiple portions are disclosed. A wavelength conversion element can be mounted over a source, the wavelength conversion element including wavelength conversion material remote to the source, such as on or near the outside surface of a conversion element. The element can be filled with a transparent and thermally conductive material which thermally couples the remote conversion material and the source, aiding in thermal dissipation and improving fixture efficacy. An optical element can be formed by using an embossing plate to form a first portion, partially curing the first portion, removing the embossing plate, and introducing material to form a second portion.

24 Claims, 15 Drawing Sheets

(56) References Cited

U.S. PATENT DOCUMENTS

| | | | |
|---|---|---|---|
| 5,463,280 A | 10/1995 | Johnson | |
| 5,519,596 A | 5/1996 | Woolverton | |
| 5,535,230 A | 7/1996 | Abe | |
| 5,561,346 A | 10/1996 | Byrne | 313/512 |
| 5,581,683 A | 12/1996 | Bertignoll et al. | |
| 5,585,783 A | 12/1996 | Hall | |
| 5,655,830 A | 8/1997 | Ruskouski | |
| 5,688,042 A | 11/1997 | Madadi | |
| 5,806,965 A | 9/1998 | Deese | 362/249 |
| 5,838,101 A | 11/1998 | Pappalardo | 313/487 |
| 5,850,126 A | 12/1998 | Kanbar | |
| 5,890,794 A | 4/1999 | Abtahi et al. | |
| 5,931,570 A | 8/1999 | Yamuro | |
| 5,934,798 A | 8/1999 | Roller et al. | 362/497 |
| 5,947,588 A | 9/1999 | Huang | |
| 5,949,347 A | 9/1999 | Wu | |
| 5,956,106 A | 9/1999 | Petersen | |
| 5,959,316 A | 9/1999 | Lowery | |
| 6,147,367 A | 11/2000 | Yang et al. | 257/88 |
| 6,218,785 B1 | 4/2001 | Incerti | 315/185 S |
| 6,220,722 B1 | 4/2001 | Begemann | 362/231 |
| 6,220,731 B1 | 4/2001 | Ryan | 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,270,722 B1 | 8/2001 | Yang et al. | 422/37 |
| 6,276,822 B1 | 8/2001 | Bedrosian et al. | |
| 6,350,041 B1 | 2/2002 | Tarsa et al. | |
| 6,465,961 B1 | 10/2002 | Cao | 315/58 |
| 6,523,978 B1 | 2/2003 | Huang | 362/252 |
| 6,550,953 B1 | 4/2003 | Ichikawa et al. | |
| 6,634,770 B2 | 10/2003 | Cao | 302/294 |
| 6,659,632 B2 | 12/2003 | Chen | |
| 6,709,132 B2 | 3/2004 | Ishibashi | |
| 6,746,885 B2 | 6/2004 | Cao | 438/26 |
| 6,764,202 B1 | 7/2004 | Herring et al. | 362/371 |
| 6,803,607 B1 | 10/2004 | Chan et al. | |
| 6,848,819 B1 | 2/2005 | Arndt et al. | |
| 6,860,620 B2 | 3/2005 | Kuan et al. | 362/294 |
| 6,864,513 B2 | 3/2005 | Lin et al. | |
| 6,948,829 B2 | 9/2005 | Verdes et al. | 362/227 |
| 6,982,518 B2 | 1/2006 | Chou et al. | |
| 6,997,580 B2 | 2/2006 | Wong | 362/311.02 |
| 7,048,412 B2 | 5/2006 | Martin et al. | |
| 7,080,924 B2 | 7/2006 | Tseng et al. | |
| 7,086,756 B2 | 8/2006 | Maxik | |
| 7,086,767 B2 | 8/2006 | Sidwell et al. | |
| 7,144,135 B2 | 12/2006 | Martin et al. | |
| 7,160,012 B2 | 1/2007 | Hilscher et al. | |
| 7,160,120 B2 | 1/2007 | Zhang et al. | |
| 7,165,866 B2 | 1/2007 | Li | |
| 7,172,314 B2 | 2/2007 | Currie et al. | |
| 7,213,940 B1 | 5/2007 | Van de Ven | 257/89 |
| D546,980 S | 7/2007 | Lo | |
| D553,267 S | 10/2007 | Yuen | |
| 7,354,174 B1 | 4/2008 | Yan | |
| 7,377,674 B2 | 5/2008 | Klinkman et al. | 362/484 |
| 7,396,142 B2 | 7/2008 | Laizure, Jr. et al. | |
| 7,405,857 B2 | 7/2008 | Ma et al. | |
| 7,413,325 B2 | 8/2008 | Chen | 362/249.01 |
| 7,547,124 B2 | 6/2009 | Chang et al. | 362/373 |
| 7,549,782 B2 | 6/2009 | Ng et al. | 362/555 |
| 7,553,047 B2 | 6/2009 | Shin et al. | 362/294 |
| 7,588,351 B2 | 9/2009 | Meyer et al. | 362/294 |
| 7,600,882 B1 | 10/2009 | Morejon et al. | |
| 7,607,802 B2 | 10/2009 | Kang et al. | 362/294 |
| 7,614,759 B2 | 11/2009 | Negley | |
| 7,618,157 B1 | 11/2009 | Galvez | |
| 7,663,315 B1 | 2/2010 | Hulse | |
| 7,686,478 B1 | 3/2010 | Hulse et al. | |
| 7,710,016 B2 | 5/2010 | Miki | 257/98 |
| 7,726,836 B2 | 6/2010 | Chen | |
| 7,753,568 B2 | 7/2010 | Hu et al. | 362/373 |
| 7,824,065 B2 | 11/2010 | Maxik | |
| D629,928 S | 12/2010 | Chen | |
| 7,884,538 B2 | 2/2011 | Mitsuishi et al. | 313/502 |
| 7,976,335 B2 | 7/2011 | Weber et al. | 439/487 |
| 7,989,236 B2 * | 8/2011 | Yamaguchi et al. | 438/26 |
| 7,999,283 B2 | 8/2011 | Chakraborty et al. | |
| 8,021,025 B2 | 9/2011 | Lee | |
| 8,253,316 B2 | 8/2012 | Sun et al. | |
| 8,272,762 B2 | 9/2012 | Maxik et al. | |
| 8,274,241 B2 | 9/2012 | Guest et al. | 315/294 |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. | 257/79 |
| 8,314,537 B2 | 11/2012 | Gielen et al. | 313/46 |
| 8,322,896 B2 | 12/2012 | Falicoff et al. | |
| 8,348,470 B2 | 1/2013 | Liu et al. | 362/294 |
| 8,368,100 B2 | 2/2013 | Donofrio et al. | |
| 8,371,722 B2 | 2/2013 | Carroll | |
| 8,400,051 B2 | 3/2013 | Hakata et al. | |
| 8,410,512 B2 | 4/2013 | Andrews | 257/99 |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,449,154 B2 | 5/2013 | Uemoto et al. | |
| 8,502,468 B2 | 8/2013 | Li et al. | |
| 8,558,252 B2 | 10/2013 | Ibbetson et al. | |
| 8,564,004 B2 | 10/2013 | Tarsa et al. | |
| 8,568,009 B2 | 10/2013 | Chiang et al. | 362/563 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 8,922,106 B2 | 12/2014 | Helbing et al. | 313/318.11 |
| 2002/0047516 A1 | 4/2002 | Iwasa et al. | |
| 2002/0114169 A1 | 8/2002 | Harada | 362/558 |
| 2003/0021113 A1 | 1/2003 | Begemann | |
| 2003/0038291 A1 | 2/2003 | Cao | |
| 2003/0081419 A1 | 5/2003 | Jacob | 362/364 |
| 2003/0185005 A1 | 10/2003 | Sommers et al. | |
| 2004/0021629 A1 | 2/2004 | Sasuga et al. | |
| 2004/0159846 A1 | 8/2004 | Doxsee | |
| 2004/0201990 A1 | 10/2004 | Neyer | |
| 2004/0223315 A1 | 11/2004 | Suehiro et al. | 362/84 |
| 2005/0068776 A1 | 3/2005 | Ge | 362/296.08 |
| 2005/0168990 A1 | 8/2005 | Nagata et al. | 362/294 |
| 2005/0174780 A1 | 8/2005 | Park | 362/294 |
| 2005/0184638 A1 | 8/2005 | Mueller | 313/485 |
| 2005/0219060 A1 | 10/2005 | Curran et al. | 340/815.45 |
| 2005/0225988 A1 | 10/2005 | Chaves et al. | |
| 2005/0242117 A1 | 11/2005 | Bloomfield | |
| 2006/0097245 A1 | 5/2006 | Aanegola et al. | 257/26 |
| 2006/0138435 A1 | 6/2006 | Tarsa et al. | 257/89 |
| 2006/0152140 A1 | 7/2006 | Brandes | 313/503 |
| 2006/0152820 A1 | 7/2006 | Lien et al. | 359/726 |
| 2006/0180774 A1 | 8/2006 | Endo | 250/485.1 |
| 2006/0227558 A1 | 10/2006 | Osawa et al. | |
| 2007/0047232 A1 | 3/2007 | Kim et al. | |
| 2007/0090737 A1 | 4/2007 | Hu et al. | 313/11 |
| 2007/0091633 A1 | 4/2007 | Harrity et al. | |
| 2007/0139938 A1 | 6/2007 | Petroski | |
| 2007/0139949 A1 | 6/2007 | Tanda et al. | 362/551 |
| 2007/0158668 A1 | 7/2007 | Tarsa et al. | 257/98 |
| 2007/0182299 A1 | 8/2007 | Ouderkirk | 313/110 |
| 2007/0206375 A1 | 9/2007 | Lys | |
| 2007/0215890 A1 | 9/2007 | Harbers et al. | |
| 2007/0223219 A1 | 9/2007 | Medendorp | |
| 2007/0263405 A1 | 11/2007 | Ng et al. | |
| 2007/0267976 A1 | 11/2007 | Bohler et al. | 315/112 |
| 2007/0274080 A1 | 11/2007 | Negley et al. | 362/341 |
| 2007/0285924 A1 | 12/2007 | Morris et al. | 362/264 |
| 2007/0297183 A1 | 12/2007 | Coushaine | |
| 2008/0037257 A1 | 2/2008 | Bolta | |
| 2008/0055908 A1 | 3/2008 | Wu et al. | 362/294 |
| 2008/0080165 A1 | 4/2008 | Kim | |
| 2008/0093615 A1 | 4/2008 | Lin et al. | |
| 2008/0106893 A1 | 5/2008 | Johnson et al. | |

(56) References Cited

U.S. PATENT DOCUMENTS

| | | | |
|---|---|---|---|
| 2008/0128735 A1 | 6/2008 | Yoo | |
| 2008/0149166 A1 | 6/2008 | Beeson et al. | 136/248 |
| 2008/0173884 A1 | 7/2008 | Chitnis et al. | 257/98 |
| 2008/0179611 A1 | 7/2008 | Chitnis et al. | 257/98 |
| 2008/0232119 A1 | 9/2008 | Ribarich | 362/373 |
| 2008/0285279 A1 | 11/2008 | Ng et al. | 362/249 |
| 2008/0308825 A1 | 12/2008 | Chakraborty et al. | 257/98 |
| 2009/0001399 A1 | 1/2009 | Diana et al. | 257/98 |
| 2009/0015137 A1 | 1/2009 | Su et al. | 313/503 |
| 2009/0040760 A1 | 2/2009 | Chen et al. | 362/249 |
| 2009/0058256 A1 | 3/2009 | Mitsuishi et al. | 313/487 |
| 2009/0059559 A1 | 3/2009 | Pabst | |
| 2009/0067180 A1 | 3/2009 | Tahmosybayat | 362/339 |
| 2009/0086492 A1 | 4/2009 | Meyer | |
| 2009/0086508 A1 | 4/2009 | Bierhuizen | 362/617 |
| 2009/0095960 A1 | 4/2009 | Murayama | 257/79 |
| 2009/0101930 A1 | 4/2009 | Li | |
| 2009/0103293 A1 | 4/2009 | Harbers et al. | |
| 2009/0103296 A1 | 4/2009 | Harbers | |
| 2009/0140633 A1 | 6/2009 | Tanimoto | 313/503 |
| 2009/0141474 A1 | 6/2009 | Kolodin | |
| 2009/0161356 A1 | 6/2009 | Negley et al. | 362/231 |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0213595 A1 | 8/2009 | Alexander et al. | 362/373 |
| 2009/0217970 A1 | 9/2009 | Zimmerman et al. | 136/252 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0286337 A1 | 11/2009 | Lee | 438/27 |
| 2009/0296387 A1 | 12/2009 | Reisenauer et al. | 362/235 |
| 2009/0310368 A1 | 12/2009 | Incerti et al. | 362/326 |
| 2009/0316383 A1 | 12/2009 | Son | |
| 2009/0322197 A1 | 12/2009 | Helbing | |
| 2009/0322208 A1 | 12/2009 | Shaikevitch | 313/503 |
| 2009/3233333 | 12/2009 | Chang | |
| 2010/0025700 A1 | 2/2010 | Jung | |
| 2010/0026185 A1 | 2/2010 | Betsuda et al. | 315/32 |
| 2010/0027258 A1 | 2/2010 | Maxik et al. | 362/240 |
| 2010/0134047 A1 | 6/2010 | Hasnain | |
| 2010/0149814 A1 | 6/2010 | Zhai et al. | 257/88 |
| 2010/0170075 A1 | 7/2010 | Kanade et al. | 29/428 |
| 2010/0177522 A1 | 7/2010 | Lee | 362/373 |
| 2010/0201284 A1 | 8/2010 | Kraus | |
| 2010/0207502 A1 | 8/2010 | Cao et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0259918 A1 | 10/2010 | Rains, Jr. | 362/84 |
| 2010/0264799 A1 | 10/2010 | Liu et al. | 313/46 |
| 2010/0264826 A1 | 10/2010 | Yatsuda | 315/112 |
| 2010/0314985 A1 | 12/2010 | Premysler | 313/46 |
| 2010/0327745 A1 | 12/2010 | Dassanayake | 315/35 |
| 2010/0328925 A1 | 12/2010 | Hoelen | 362/84 |
| 2011/0001151 A1 | 1/2011 | Le Toquin | |
| 2011/0044022 A1 | 2/2011 | Ko et al. | 362/84 |
| 2011/0058379 A1 | 3/2011 | Diamantidis | 362/296.01 |
| 2011/0068356 A1 | 3/2011 | Chiang | 257/98 |
| 2011/0074271 A1 | 3/2011 | Takeshi et al. | 313/46 |
| 2011/0074296 A1 | 3/2011 | Shen et al. | |
| 2011/0080740 A1 | 4/2011 | Allen | 362/294 |
| 2011/0089804 A1 | 4/2011 | Mahalingam et al. | 313/46 |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0149578 A1 | 6/2011 | Niiyama | 362/294 |
| 2011/0175528 A1 | 7/2011 | Rains et al. | 315/51 |
| 2011/0176316 A1 | 7/2011 | Phipps et al. | |
| 2011/0215696 A1 | 9/2011 | Tong et al. | 313/46 |
| 2011/0215699 A1 | 9/2011 | Le et al. | |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van de Ven et al. | 315/35 |
| 2012/0320591 A1 | 12/2012 | Liao et al. | 362/249 |
| 2013/0049018 A1 | 2/2013 | Ramer et al. | 257/81 |
| 2013/0063945 A1 | 3/2013 | Wu et al. | 362/249 |
| 2013/0119280 A1* | 5/2013 | Fuchi et al. | 250/504 R |
| 2013/0249374 A1 | 9/2013 | Lee et al. | 313/12 |
| 2013/0293098 A1* | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1802533 | 7/2006 |
| CN | 1922286 A | 2/2007 |
| CN | 101128695 | 2/2008 |
| CN | 10126232 A | 9/2008 |
| CN | 101262032 | 9/2008 |
| CN | 1013388887 A | 1/2009 |
| CN | 101368719 A | 2/2009 |
| CN | 101641623 | 2/2010 |
| CN | 102077011 | 5/2011 |
| DE | 4311937 A1 | 10/1994 |
| DE | 10251955 | 5/2004 |
| DE | 102004051382 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0876085 | 11/1998 |
| EP | 0876085 A2 | 11/1998 |
| EP | 0890059 A1 | 1/1999 |
| EP | 0936682 A1 | 8/1999 |
| EP | 1058221 A2 | 12/2000 |
| EP | 1881259 | 1/2008 |
| EP | 2146135 A2 | 1/2010 |
| EP | 2154420 | 2/2010 |
| EP | 2941346 | 7/2010 |
| EP | 2469154 | 6/2012 |
| GB | 1423011 | 1/1976 |
| GB | 2345954 A | 7/2000 |
| GB | 2 366 610 A | 3/2002 |
| GB | 2366610 | 3/2002 |
| JP | H06283006 | 10/1994 |
| JP | H09265807 | 10/1997 |
| JP | H11177149 | 7/1999 |
| JP | 11-213730 A | 8/1999 |
| JP | H11260125 | 9/1999 |
| JP | 2000022222 | 1/2000 |
| JP | 2000173304 | 6/2000 |
| JP | 2001118403 | 4/2001 |
| JP | 2002525814 | 8/2002 |
| JP | 2003515899 | 5/2003 |
| JP | 2004146225 | 5/2004 |
| JP | 2004241318 | 8/2004 |
| JP | 2005-093097 A | 4/2005 |
| JP | 2005108700 | 4/2005 |
| JP | 20051008700 | 4/2005 |
| JP | 2005244226 | 9/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006106661 | 4/2006 |
| JP | 2006148147 | 6/2006 |
| JP | 2006156187 | 6/2006 |
| JP | 20066159187 | 6/2006 |
| JP | 200640850 A | 9/2006 |
| JP | 2006525648 | 11/2006 |
| JP | 2006331683 | 12/2006 |
| JP | 2007049019 | 2/2007 |
| JP | A2007049019 | 2/2007 |
| JP | 200759930 | 3/2007 |
| JP | 2007059911 | 3/2007 |
| JP | 2007081090 | 3/2007 |

(56) References Cited

FOREIGN PATENT DOCUMENTS

| | | |
|---|---|---|
| JP | 2007184330 | 7/2007 |
| JP | 3138653 | 12/2007 |
| JP | 2008505448 | 2/2008 |
| JP | 2008508742 | 3/2008 |
| JP | 2008091140 | 4/2008 |
| JP | 2008108835 | 5/2008 |
| JP | 2008523639 | 7/2008 |
| JP | 2008187195 | 8/2008 |
| JP | 2008262465 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | 3153766 | 8/2009 |
| JP | U3153766 | 8/2009 |
| JP | 2009238960 | 10/2009 |
| JP | 2009266780 | 11/2009 |
| JP | 2009277586 | 11/2009 |
| JP | 2009295299 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | WO2009028861 | 3/2009 |
| KR | 100944181 | 2/2010 |
| KR | 1020100037353 | 4/2010 |
| KR | 100980588 B1 | 9/2010 |
| KR | 3020110008445 | 3/2011 |
| TW | 200505054 | 2/2005 |
| TW | 200507686 | 2/2005 |
| TW | 200527664 | 8/2005 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200930937 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | WO 00/17569 A1 | 3/2000 |
| WO | WO0124583 A1 | 4/2001 |
| WO | WO 01/40702 A1 | 6/2001 |
| WO | WO0160119 A2 | 8/2001 |
| WO | WO2004068599 | 8/2004 |
| WO | 2004100213 A2 | 11/2004 |
| WO | WO2004100213 | 11/2004 |
| WO | WO2006012043 | 2/2006 |
| WO | WO2006059535 A2 | 6/2006 |
| WO | WO2006065558 | 6/2006 |
| WO | WO 2007/130358 A2 | 11/2007 |
| WO | WO2007146566 A2 | 12/2007 |
| WO | WO 2008/018002 A2 | 2/2008 |
| WO | WO2008018001 | 2/2008 |
| WO | WO2008018002 | 2/2008 |
| WO | WO 2008/052318 A1 | 5/2008 |
| WO | WO 2008/117211 A1 | 10/2008 |
| WO | WO2004100213 A2 | 11/2008 |
| WO | WO2008134056 A1 | 11/2008 |
| WO | WO 2008/146229 A2 | 12/2008 |
| WO | WO2008146229 | 12/2008 |
| WO | WO 2009/024952 A2 | 2/2009 |
| WO | WO2009052099 | 4/2009 |
| WO | WO 2009/091562 A2 | 7/2009 |
| WO | WO 2009/093163 A2 | 7/2009 |
| WO | WO2009091562 | 7/2009 |
| WO | WO2009093163 | 7/2009 |
| WO | WO 2009/107052 A1 | 9/2009 |
| WO | WO2009107052 | 9/2009 |
| WO | 2009125314 A2 | 10/2009 |
| WO | WO 2009/119038 A2 | 10/2009 |
| WO | WO 2009/128004 A1 | 10/2009 |
| WO | WO2009119038 | 10/2009 |
| WO | WO2009131627 | 10/2009 |
| WO | WO 2009/158422 A1 | 12/2009 |
| WO | WO2009148543 | 12/2009 |
| WO | WO2009158422 | 12/2009 |
| WO | 2010013898 A2 | 2/2010 |
| WO | WO 2010/012999 A2 | 2/2010 |
| WO | WO2010012999 | 2/2010 |
| WO | WO2010013893 | 2/2010 |
| WO | WO2010052610 | 5/2010 |
| WO | WO 2010/119618 A1 | 10/2010 |
| WO | WO 2010/128419 A1 | 11/2010 |
| WO | WO2011100193 | 8/2011 |
| WO | WO2011109091 A1 | 9/2011 |
| WO | WO2011109098 | 9/2011 |
| WO | WO2012011279 | 1/2012 |
| WO | WO2012031533 | 3/2012 |

OTHER PUBLICATIONS

Cree XLamp CXA1520 LED Product Family Data Sheet, www.cree.com, 15 pages.
Cree XLamp CXA2520 LED Product Family Data Sheet, www.cree.com, 19 pages.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 13/034,501, filed Feb. 24, 2011, Le, et al.
U.S. Appl. No. 13/770,389, filed Feb. 19, 2013, Sun, et al.
U.S. Appl. No. 11/029,005, filed Feb. 16, 2011, Tong, et al.
U.S. Appl. No. 13/029,025, filed Feb. 16, 2011, Tong, et al.
U.S. Appl. No. 13/536,707, filed Jun. 28, 2012, Le Toquin, et al.
U.S. Appl. No. 12/151,089, filed May 2, 2008, Chakraborty, et al.
U.S. Appl. No. 13/837,442, filed Mar. 15, 2013, Gupta, et al.
U.S. Appl. No. 13/804,309, filed Mar. 14, 2013, Castillo, et al.
U.S. Appl. No. 11/895,573, filed Aug. 24, 2007, Chakraborty, et al.
U.S. Appl. No. 12/498,253, filed Jul. 6, 2009, Le Toquin, et al.
U.S. Appl. No. 12/00,429, filed Dec. 14, 2007, Loh, et al.
U.S. Appl. No. 13/544,662, filed Jul. 9, 2012, Tarsa, et al.
U.S. Appl. No. 13/842,307, filed Mar. 15, 2013, Ibbetson, et al.
U.S. Appl. No. 13/902,080, filed May 24, 2013, Lowes, et al.
U.S. Appl. No. 13/607,300, filed Sep. 7, 2012, Progl, et al.
U.S. Appl. No. 13/758,763, filed Feb. 4, 2013, Leung, et al.
U.S. Appl. No. 13/840,887, filed Mar. 15, 2013, Ven de Ven, et al.
U.S. Appl. No. 13/828,348, filed Mar. 14, 2013, Edmond, et al.
U.S. Appl. No. 12/717,048, filed Mar. 3, 2010, Donofrio, et al.
U.S. Appl. No. 13/306,589, filed Nov. 29, 2011, Tarsa, et al.
International Search Report and Written Opinion for PCT Patent Application No. PCT/US2011/000405 mailed Nov. 2, 2011.
International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion, PCT/US2009/063804, Mailed on Feb. 26, 2010.

(56) References Cited

OTHER PUBLICATIONS

U.S. Appl. No. 12/566,195, Van De Ven, filed Sep. 24, 2009.
U.S. Appl. No. 12/704,730, Van De Ven, filed Feb. 12, 2010.
C.Crane Geobulb®-II LED Light Bulb, Item #2SW, Description, p. 1-2.
Cree LR4, 4" and 6" Recessed Architectural Downlight, Product Info p. 1-2.
U.S. Appl. No. 12/757,179, filed Apr. 9, 2010, Yuan, et al.
U.S. Appl. No. 12/901,405, filed Oct. 8, 2010, Tong.
U.S. Appl. No. 61/339,515, filed Mar. 3, 2010, Tong.
U.S. Appl. No. 12/975,820, Van De Ven.
U.S. Appl. No. 13/029,063, filed Feb. 16, 2011, Hussell.
U.S. Appl. No. 13/358,901, filed Jan. 26, 2012, Progl, et al.
WhiteOptics™ White97 Film, Reflector Film Technical Data Sheet from WhiteOptics, LLC, New Castel, DE.
WhiteOptics™ Metal, Technical Data Sheet from WhiteOptics, LLC, New Castel, DE.
U.S. Appl. No. 13/649,052, filed Oct. 10, 2012, Lowes, et al.
U.S. Appl. No. 13/649,067, filed Oct. 10, 2012, Lowes, et al.
U.S. Appl. No. 13/018.245, filed Jan. 31, 2011, Tong.
U.S. Appl. No. 12/848,825, filed Aug. 2, 2010, Tong.
U.S. Appl. No. 13/017,778, filed Jan. 31, 2011, Andrews.
U.S. Appl. No. 61/435,759, filed Jan. 24, 2011 Le.
U.S. Appl. No. 61/339,516, filed Mar. 3, 2010 Tong.
US Publication No. 2010/0155763, Filing Date Jun. 24, 2010 Donofrio.
U.S. Appl. No. 61/424,670, filed Dec. 19, 2010, Zongjie Yuan.
Nichia Corp Part Spec, *High Brightness LEDS*, (May 1999), 15 pgs EA. (NSPW 300BS, NSPW 312BS, Etc).
U.S. Appl. No. 13/022,490, filed Feb. 7, 2011, Tong.
International Search Report and Written Opinion for PCT/US2011/000403 mailed Aug. 23, 2011.
International Search Report and Written Opinion for PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
International Search Report and Written Opinion for counterpart PCT Application No. PCT/US2011/000397 mailed May 24, 2011.
International Search Report and Written Opinion for PCT Application No. PCT/US2010/003146 mailed Jun. 7, 2011.
Decision for Final Rejection for Japanese Patent Application No. 2001-542133 mailed Jun. 28, 2011.
International Search Report and Written Opinion for PCT/US2011/000400 mailed May 2, 2011.
Energy Star® Program Requirements for Integral LED Lamps, amended Mar. 22, 2010.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
Notice To Submit A Response from Korean Patent Application No. 30-2011-0008448, dated Apr. 16, 2012.
Notice to Submit A Response from Korean Patent Application No. 30-2011-0008445, dated Apr. 16. 2012.
Notice to Submit A Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
Notice to Submit a Response from Korean Design Patent Application No. 30-2011-0024961, dated Sep. 10, 2012.
International Search Report and Written Opinion from PCT Application No PCT/US2012/044705 dated Oct. 9, 2012.
Notice to Submit a Response from Korean Patent Application No. 30-2011-0008446. dated Oct. 22, 2012.
Search Report and Written Opinion from PCT Application No. PCT/US2012/072108, dated Feb. 27, 2013.
Notice of Reasons for Rejection from Japanese Patent Appl. No. 2012-543086, dated Aug. 27, 2013.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from Japanese Patent Appl. No. 2012-556064, dated Oct. 29, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
First Office Action from Chinese Patent Appl. No. 201080062056.X, dated Feb. 12, 2014.
Office Action from Japanese Patent Appl. No 2012-556066, dated Mar. 14, 2014.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.
Office Action from U.S. Appl. No. 13/028,913, dated Nov. 4, 2013.
Office Action from U.S. Appl. No 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Office Action from U.S. Appl. No. 11/149,999, dated Jan. 15, 2014.
Office Action from U.S. Appl. No. 13/034,501, dated Jan. 23, 2014.
Office Action from U.S. Appl. No. 13/028,913, dated Feb. 19, 2014.
Office Action from U.S. Appl. No. 13/026,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
First Office Action from Chinese Appl. No. 201180022626.7, dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2019.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from U.S. Appl. No. 13/029,068, dated Jun. 13, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No 2012-556065, dated Aug. 5, 2014.

(56) References Cited

OTHER PUBLICATIONS

Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
Second Office Action and Search Report from Chinese Patent Appl. No 2011600207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 12/901,405, dated Feb. 4, 2015.
First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Office Action from U.S. Appl. No. 13/029.063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from U.S. Appl. No. 13/028,863, dated May 9, 2014.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No 2011800207069, dated Dec. 5, 2014.
Third Office Action from Chinese Patent Appl. No. 2011800207092, dated Jul. 13, 2015.
Notice of Allowance from Japanese Patent Appl. No. 2019-122693, dated Sep. 3, 2015.
Notification of the Fourth Office Action from Chinese Patent Appl. No. 2011800207069, dated Aug. 24, 2015.
Decision of Rejection from Japanese Patent Appl. No. 2012-566065, dated Aug. 18, 2015.
Second Office Action from Chinese Patent Appl. No. 2011800226267, dated Aug. 3, 2015.
Office Action from U.S. Appl. No. 13/029,025, dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029,063, dated Sep. 17, 2015.
Office Action from U.S. Appl. No. 11/149,999, dated Oct. 1, 2015.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl, No. 2012-556065, dated Apr. 10, 2015.
Second Office Action from Chinese Patent Appl. No. 2011800223837, dated Apr. 13, 2015.
Communication from European Patent Appl. No, 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.
Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 11/149,999, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Examination from European Patent Appl. No. 10799139.0, dated Nov. 18, 2015.
Request for Correction from Chinese Patent Appl. No 201180022606X, dated Nov. 12, 2015.
Third Office Action from Chinese Patent Appl. No. 2011800223856, dated Nov. 2, 2015.
Office Action from U.S. Appl. No. 13/536,707, dated Nov. 16, 2015.
Office Action from U.S. Appl. No. 13/029,068, dated Dec. 3, 2015.
Office Action from U.S. Appl. No. 14/453,482, dated Oct. 1, 2015.
Office Action from U.S. Appl. No. 14/108,815, dated Nov. 5, 2015.
Summons to Oral Proceedings from European Patent Appl. No. 09152962/2166580, dated Jan. 29, 2015.

(56) References Cited

OTHER PUBLICATIONS

Third Office Action from Chinese Patent Appl. No. 2011800223856—translations only, original already submitted.
Official Notification and Search Report from Taiwanese Patent appl. No. 10421609300. dated Dec. 1, 2015.
Official Notification and Search Report from Taiwanese Patent appl. No. 11421621560, dated Dec. 2, 2015.
Third Office Action from Chinese Patent Appl. No. 2011800226248, dated Nov. 20, 2015.
Official Notification and Search Report from Taiwanese Patent appl. No 10421651990, dated Dec. 7, 1015.
Notice of Issuance from Chinese Patent Appl. No. 2011800226063X. dated Dec. 10, 2015.
Official Notification and Search Report from Taiwanese Patent Appl. No. 10421595210, dated Nov. 27, 2015.
Office Action from Chinese Patent Appl. No. 201180022583.2, dated Dec. 17, 2015.
Examination from European Patent appl. No. 11 710 906.6-1757. dated Jan. 8, 2016.
Examination from European Patent appl. No. 11 710 348.1-1757, dated Jan. 8, 2016.
Office Action from U.S. Appl. No. 13/029,025; Jan. 6, 2016.
Office Action from U.S. Appl. No. 13/430,478; Jan. 7, 2016.
Office Action from U.S. Appl. No. 13/758,763; Feb. 2, 2016.
Office Action from U.S. Appl. No. 13/029,063; Feb. 11, 2016.
Summons to Oral Proceedings from European Patent Appl. No. 09152962/2166580. dated Jan. 29, 2015.
First Office Action from Chinese Patent Appl. No. 2011800225832, dated Jan. 20, 2015.
First Office Action from Chinese Patent Appl. No 2011800226214, dated Dec. 25, 2014.
Fourth Office Action from Chinese Patent Appl. No. 201180020709.2, Dated Jan. 25, 2016
Decision of Rejection from Chinese Patent Appl. No. 201180020706.9, dated Mar. 2, 2016.
Re-Examination Report from Japanese Patent Appl. No. 2012-556065, dated Feb. 1, 2016.
Examination Report from European Patent Appl. No. 11 709 509.1-1757. Dated Mar. 4, 2016.
Office Action from U.S. Appl. No. 13/029,025: Jan. 6, 2016.
Office Action from U.S. Appl. No. 13/430,478: Jan. 7, 2016.
Office Action from U.S. Appl. No. 13/758,763: Feb. 2, 2016.
Office Action from U.S. Appl. No. 13/029,063: Feb. 11, 2016.
Office Action from U.S. Appl. No. 12/985,275: Feb. 18, 2016.
Office Action from U.S. Appl. No. 14/453.482: Apr. 1, 2016.

\* cited by examiner

| Configuration | Picture |
|---|---|
| Prior art "dam and fill" |  |
| Dome encapsulant + optic (hollow) |  |
| Optic (hollow) |  |
| Optic (filled with silicone) (192) | |
| Glass optic with phosphor coating (194) |  |
| Silicone optic with phosphor coating (196) |  |
| Flat encapsulant with phosphor coating (198) |  |

FIG. 20
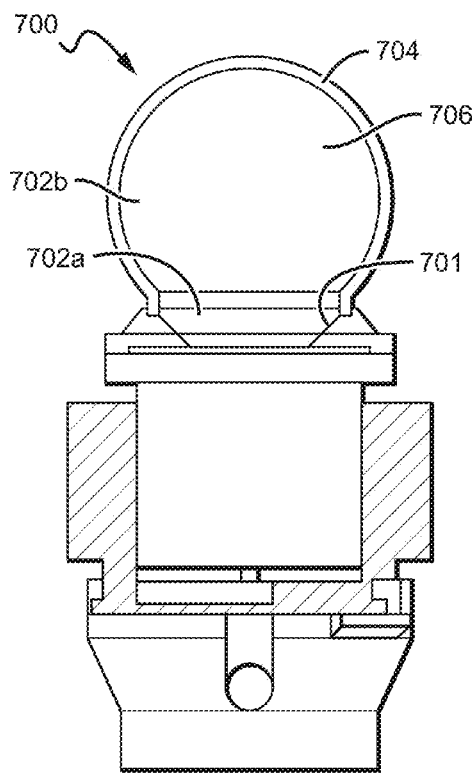
FIG. 21
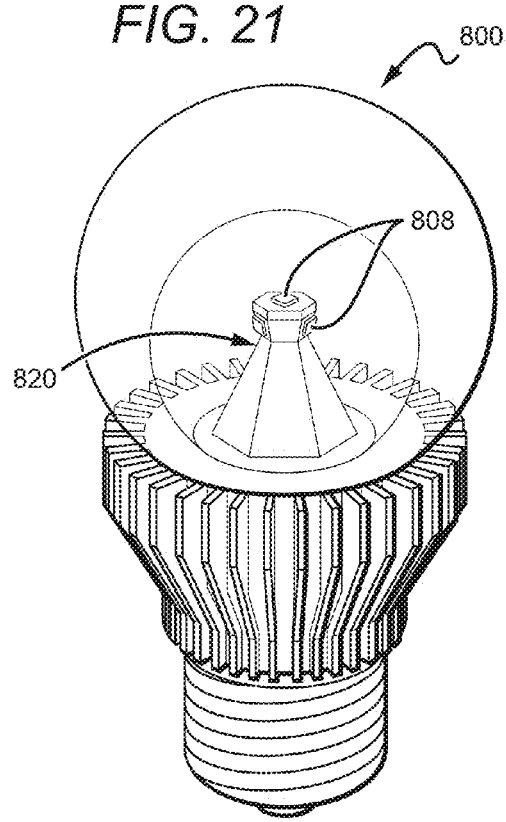
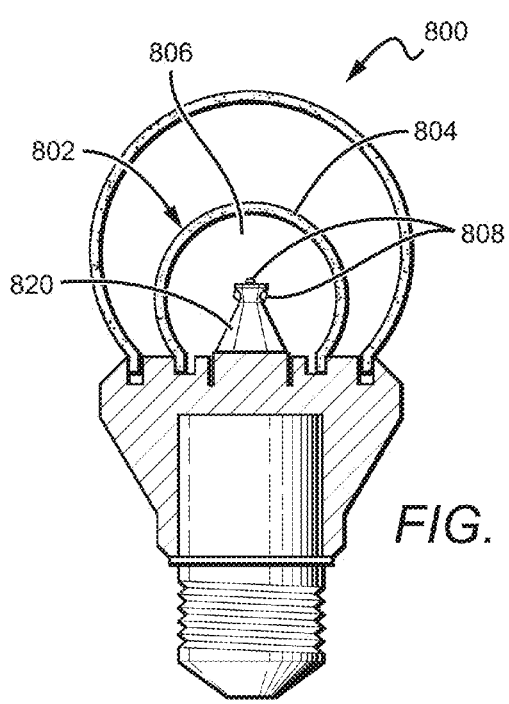
FIG. 22

REMOTE PHOSPHOR ELEMENT FILLED WITH TRANSPARENT MATERIAL AND METHOD FOR FORMING MULTISECTION OPTICAL ELEMENTS

BACKGROUND OF THE INVENTION

1. Field of the Invention

This invention pertains generally to light wavelength conversion elements for use in light emitting packages, and in particular to conversion elements including a thermally conductive material that can be thermally coupled to a light source. This invention also pertains to methods for fabricating optical elements.

2. Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package can also include electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2, can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in commonly assigned U.S. patent application Ser. Nos. 11/656,759 and 11/899,790, both to Chitnis et al. and both entitled "Wafer Level Phosphor Coating Method and Devices Fabricated Utilizing Method". Alternatively, the LED chips can be coated using other methods such as electrophoretic deposition (EPD), with a suitable EPD method described in commonly assigned U.S. patent application Ser. No. 11/473,089 to Tarsa et al. entitled "Close Loop Electrophoretic Deposition of Semiconductor Devices".

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that emits from the surface of the lens 36 on the first pass is maximized. This can result in relatively large devices where the distance from the LED to the edge of the lens is maximized, and the edge of the submount can extend out beyond the edge of the encapsulant. These devices generally produce a Lambertian emission pattern that is not always ideal for wide emission area applications. In some conventional packages the emission profile can be approximately 120 degrees full width at half maximum (FWHM).

Lamps have also been developed utilizing solid state light sources, such as LED chips, in combination with a conversion material that is separated from or remote to the LED chips. Such arrangements are disclosed in commonly assigned U.S. Pat. No. 6,350,041 to Tarsa et al., entitled "High Output Radial Dispersing Lamp Using a Solid State Light Source." The lamps described therein can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

One potential disadvantage of lamps incorporating remote phosphors is that they can have undesirable visual or aesthetic characteristics. For example, when a lamp is not generating light the lamp can have a surface color that is different from the typical white or clear appearance of the standard Edison bulb. In some instances the lamp can have a yellow or orange appearance, primarily resulting from the phosphor conversion material, such as yellow/green and red phosphors. This appearance can be considered undesirable for many applications where it can cause aesthetic issues with the surrounding architectural elements when the light is not illuminated. This can have a negative impact on the overall consumer acceptance of these types of lamps.

Further, compared to conformal or adjacent phosphor arrangements where heat generated in the phosphor layer during the conversion process may be conducted or dissipated via the nearby chip or substrate surfaces, remote phosphor arrangements can be subject to inadequate thermally conductive heat dissipation paths. Without an effective heat dissipation pathway, thermally isolated remote phosphors may suffer from elevated operating temperatures that in some instances can be even higher than the temperature in comparable conformal coated layers. This can offset some or all of the benefit achieved by placing the phosphor remotely with respect to the chip. Stated differently, remote phosphor placement relative to the LED chip can reduce or eliminate direct heating of the phosphor layer due to heat generated within the LED chip during operation, but the resulting phosphor temperature decrease may be offset in part or entirely due to heat generated in the phosphor layer itself during the light conversion process and lack of a suitable thermal path to dissipate this generated heat.

Another issue affecting the implementation and acceptance of lamps utilizing solid state light sources relates to the nature of the light emitted by the light source itself. Angular uniformity, also referred to as luminous intensity distribution, is also important for solid state light sources that are to replace standard incandescent bulbs. The geometric relationship between the filament of a standard incandescent bulb and the glass envelope, in combination with the fact that no electronics or heat sink is needed, allow light from an incandescent bulb to shine in a relatively omnidirectional pattern. That is, the luminous intensity of the bulb is distributed relatively evenly across angles in the vertical plane for a vertically oriented bulb from the top of the bulb to the screw base, with only the base itself presenting a significant light obstruction.

In order to fabricate efficient lamps or bulbs based on LED light sources (and associated conversion layers), it is typically desirable to place the LED chips or packages in a co-planar arrangement. This facilitates ease of manufacturing and can reduce manufacturing costs by allowing the use of conventional production equipment and processes. However, co-planar arrangements of LED chips typically produce a forward directed light intensity profile (e.g., a Lambertian profile). Such beam profiles are generally not desired in applications where the solid-state lamp or bulb is intended to replace a conventional lamp such as a traditional incandescent bulb, which has a much more omni-directional beam pattern. While it is possible to mount the LED light sources or packages in a three-dimensional arrangement, such arrangements can be difficult and expensive to fabricate. Solid state light sources sometimes also typically include electronic circuitry and a heat sink, which may obstruct the light in some directions.

SUMMARY OF THE INVENTION

Briefly, and in general terms, the invention is directed toward wavelength conversion elements including a wavelength conversion material that can be optically and/or thermally coupled to a light source and/or heat sink by, for example, an optically transparent and thermally conductive filling, as well as devices including such wavelength conversion elements and methods for fabricating such wavelength conversion elements. The invention is also generally directed toward methods for fabricating multisection optical elements.

One embodiment of a light emitting device according to the present invention can comprise a light source and a wavelength conversion element including a filler portion and a phosphor portion on the filler portion, with the phosphor portion comprising a wavelength conversion material. The phosphor portion can be remote to and thermally coupled to the light source.

One embodiment of a wavelength conversion element according to the present invention can include an outer portion having a wavelength conversion material as well as an inner portion including a substantially transparent and thermally conductive material. The component can be substantially solid.

One embodiment of a method for fabricating a wavelength conversion component according to the present invention can include molding an outer portion that defines a cavity and includes a binder and a wavelength conversion material. The method can further include filing the cavity with a liquid filler portion and hardening the filler portion.

One embodiment of a method for fabricating an optical element according to the present invention can include filling a first portion of a cavity with a first material. The first material can be partially cured, and a second portion of the cavity can be filled with a second material such that the second material is in contact with the partially cured first material.

One embodiment of a method for fabricating one or more optical elements according to the present invention can include providing a mold with one or more cavities, and at least partially filling the one or more cavities with a first material. The method can include providing an embossing plate with one or more protrusions and pressing the one or more protrusions into the first material, partially curing the first material, and removing the one or more protrusions. The method can further include at least partially filling the cavities with a second material such that the second material is in contact with the first material before the first material is fully cured.

One embodiment of an optical element according to the present invention can include an innermost portion, a middle portion, and an outermost portion. Each of these portions can have a different composition than each other of the portions.

BRIEF DESCRIPTION OF THE DRAWINGS

FIGS. 19 and 20 are perspective and cross-sectional views, respectively, of a lamp according to yet another embodiment of the present invention.

FIGS. 21 and 22 are perspective and cross-sectional views, respectively, of a lamp according to yet another embodiment of the present invention.

DETAILED DESCRIPTION OF THE INVENTION

Figure 1:
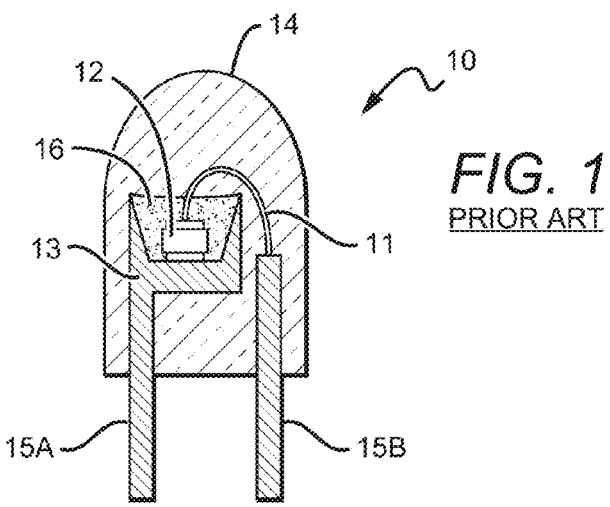
FIG. 1 is a cross-sectional view of one embodiment of a prior art LED package.
Figure 2:
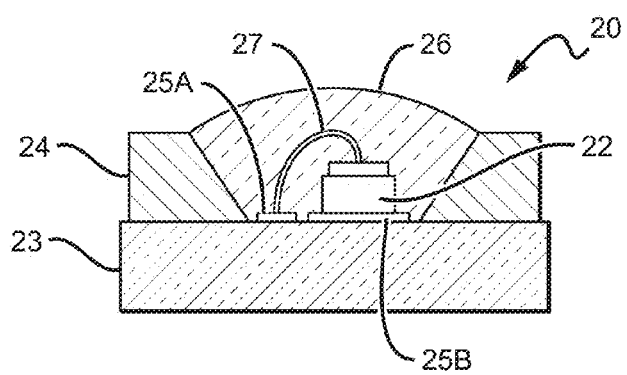
FIG. 2 is a cross-sectional view of another embodiment of a prior art LED package.
Figure 3:
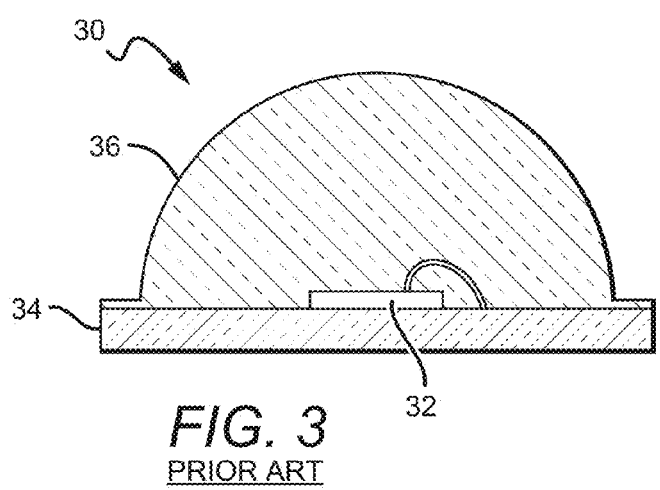
FIG. 3 is a cross-sectional view of yet another embodiment of a prior art LED package.

The present invention is directed to different embodiments of light emitting devices comprising a solid- or liquid-filled wavelength conversion element. Embodiments of the present invention can provide increased efficacy at least in part due to the arrangement of the wavelength conversion element, which can be thermally coupled to the source and/or a heat sink. A wavelength conversion element can have an outer phosphor portion and an inner filler portion which can thermally couple the source and/or heat sink to the phosphor portion. By thermally coupling the phosphor portion to the source and/or heat sink, heat generated in the phosphor portion by wavelength conversion can be efficiently dissipated through the filler portion. The phosphor portion can be remote to the source to prevent overheating and/or damage to the phosphor. The filler portion can be transparent and thermally conductive.

Embodiments of the present invention can also provided increased efficacy due to a reduction in the number of material interfaces through which emitted light must pass. For example, light emitted from a source can pass directly into a filler portion. In addition to phosphor particles, the phosphor portion can comprise the same material as the filler portion, such as silicone, which can eliminate another material interface. By eliminating or reducing material interfaces, optical losses due to differences in indices of refraction can be reduced and/or eliminated, resulting in higher efficacy and efficiency.

Wavelength conversion elements according to the present invention can have many different properties, such as different shapes and materials. For example, wavelength conversion elements can be frustospherical, hemispherical, rectangular, cylindrical, bullet-shaped or many other shapes, as will be discussed in detail below. One material that can be used for the filler portion and/or a binder in the phosphor portion is silicone, which is substantially transparent and thermally conductive. Many other materials are possible, such as but not limited to epoxies, glass, dielectrics, polymers, sol gel glass, plastics, and hybrids thereof, as well liquids such as siloxane, siloxane oils, and other thermally stable and/or chemically compatible liquids. Further, the filler portion can be solid-phase, liquid-phase, a mix of the two, or can alternate between the two due to, for example, heat from a source. The use of a liquid filler portion can improve thermal dissipation through convective cooling of the phosphor portion in addition to conductive cooling. In one embodiment, the filler portion is liquid during times of operation and non-operation; in another embodiment, the filler portion is liquid during operation and solid phase during non-operation. One such material capable of changing phases in such a manner is low melting temperature glass, although other materials are possible.

Wavelength conversion elements according to the present invention can be a component-level element that can be used in various systems. For example, wavelength conversion elements can be used in bulbs, lamps, low-bay and high-bay fixtures, troffers, and many other applications.

Although the above embodiments have been described with respect to wavelength conversion particles, optical elements according to the present invention can comprise many different materials and/or types of particles. For example, one portion in an optical element can comprise scattering particles that can assist in color mixing and/or beam shaping. As another example, multiple layers can form a progression, such as from a higher index of refraction near a source to a lower index of refraction on the outside of the optical element. Further, some layers can cover some but not all surfaces of the optical element. For example, a layer of scattering particles can be on the side surface of a cylindrical optical element, while the top surface does not include a layer with scattering particles. Any single layer can comprise multiple of the above materials.

Many different methods can be used to fabricate embodiments of the present invention. For example, a wavelength conversion element can be fabricated by injection molding an outer phosphor portion that can define a cavity, and filling the cavity with a filler portion that is in liquid form. The filler portion can then optionally be hardened before or after attachment to, for example, a mount surface. In one embodiment that is particularly useful for minimizing air pockets within the wavelength conversion element and thus minimizing the number of material interfaces, a phosphor portion can be filled with a filler portion. A source and/or mount surface can then be inserted into the wavelength conversion element and occupy an area previously occupied by part of the filler portion, which can cause excess filler portion material to be removed. If the filler portion is liquid, this method can be performed in an inverted manner, such that the wavelength conversion element is upside-down and an inverted mount surface and source is lowered into the wavelength conversion element.

Another method of forming optical elements according to the present invention can utilize one or more embossing plates and/or molding of different sections of the optical elements at different times. For example, a protrusion of an embossing plate can occupy an area of a mold that is to be filled during a second molding phase. The unoccupied space can be filled with material to form a first portion of the optical element, which can then be partially cured. The embossing plate can then be removed and the newly unoccupied space can be filled with material to form a second portion of the optical element. The partially cured first portion can maintain its shape and/or remain distinct from the second portion while still maintaining open or free bonding sites for bonding to the material of the second portion, which can ensure a mechanically and/or optically smooth transition between the first and second portions. The optical element comprising the first and second portions can be cured to form a single component. Alternatively, while the second portion is still at least partially uncured, a source, such as a source attached to a substrate, can be placed within the second portion, and the second portion cured on and/or around the source as with overmolding. This can ensure that light from the source travels through the least number of optical material transitions as possible.

The present invention is described herein with reference to certain embodiments, but it is understood that the invention can be embodied in many different forms and should not be construed as limited to the embodiments set forth herein. In particular, the present invention is described below in regards to certain lamps and/or fixtures having one or multiple LEDs or LED chips or LED packages in different configurations, but it is understood that the present invention can be used for many other lamps having many different configurations. The embodiments below are described with reference to LED or LEDs and/or source or sources, but it is understood that this is meant to encompass LED chips and LED packages as well as other solid state emitters. The components can have different shapes and sizes beyond those shown and different numbers of LEDs can be included. It is also understood that some of the embodiments described below utilize co-planar light sources, but it is understood that non co-planar light sources can also be used. It is also understood that the lamp's LED light source may be comprised of one or multiple LEDs, and in embodiments with more than one LED, the LEDs may have different emission wavelengths. Similarly, some LEDs may have adjacent or contacting phosphor layers or regions, while others may have either adjacent phosphor layers of different composition or no phosphor layer at all.

The present invention is described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

Some of the embodiments described herein comprise a remote phosphor and a separate remote diffuser arrangement, with some being in a double dome arrangement. It is understood that in other embodiments there can be a single dome like structure having both the conversion and diffusing properties, or there can be more than two domes with different combinations of conversion materials and diffusers. The conversion material and diffusers can be provided in respective domes, or the conversion material and diffusers can be together on one or more of the domes. The term dome should not be construed as limited to any particular shape. The term can encompass many different three dimensional shapes, including but not limited to bullet or globe shaped, frusto-spherical, or elongated.

The present invention is described herein with reference to different elements being remote to one another. Remote in this context refers to being spaced apart from and/or to not being directly on or in direct thermal contact. It is further understood that when discussing dominant wavelengths, there is range or width of wavelengths surrounding a dominant wavelength, so that when discussing a dominant wavelength the present invention is meant to cover a range of wavelengths around that wavelength.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers, and/or sections, these elements, components, regions, layers, and/or sections should not be limited by these terms. These terms are only used to distinguish one element, component, region, layer or section from another region, layer, or section. Thus, a first element, component, region, layer, or section discussed below could be termed a second element, component, region, layer, or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
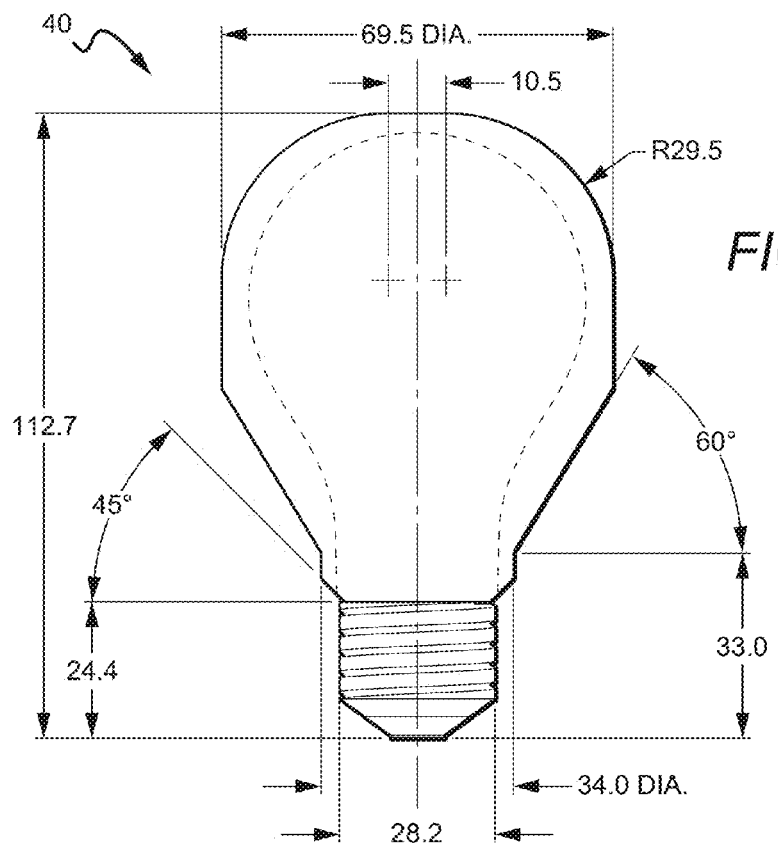
FIG. 4 is a dimensioned side view of a lamp showing the size specifications for an A19 bulb.

Different embodiments of the lamps can have many different shapes and sizes, with some embodiments having dimensions to fit into standard size envelopes, such as the A19 size envelope 30 as shown in FIG. 4. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23.

Figure 5:
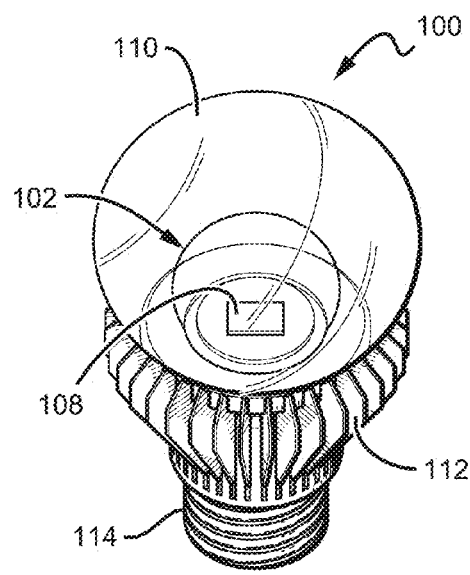
FIGS. 5-7 are perspective, exploded perspective, and cross-sectional views, respectively, of a lamp according to one embodiment of the present invention.
Figure 6:
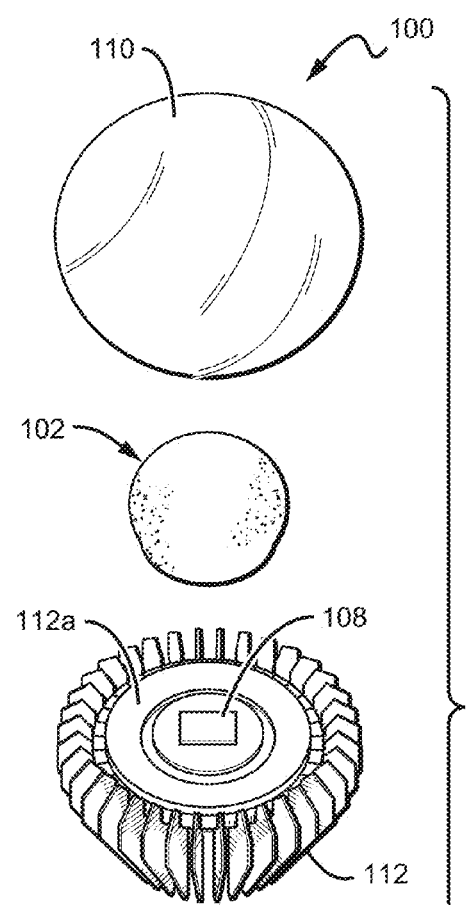
Figure 7:
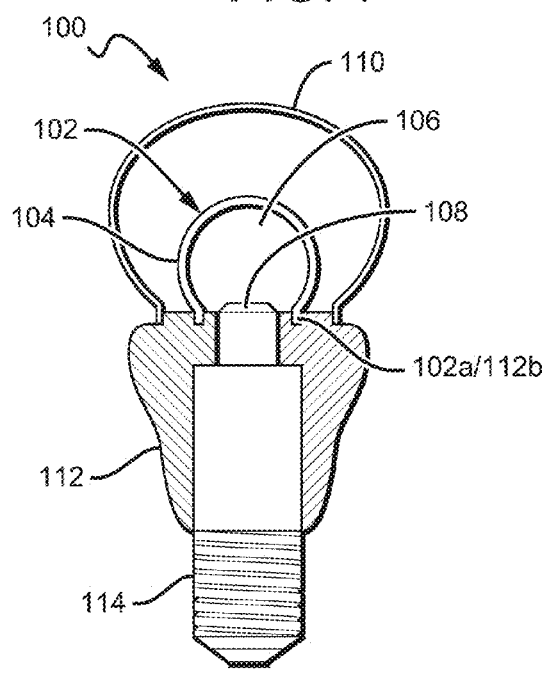

FIGS. 5-7 show an embodiment of a lamp 100 according to the present invention. The lamp can include a wavelength conversion element 102, one or more sources 108, a diffuser 110, a heat sink structure 112, and a threaded portion 114. The wavelength conversion element 102 can be on (e.g., mounted to) the heat sink structure 112 and/or thermally coupled or connected to the heat sink structure 112 and/or the sources 108. The light source 108 can comprise many different emitters with the embodiment shown comprising an LED or LED array. Many different commercially available LED chips or LED packages can be used including but not limited to those commercially available from Cree, Inc., located in Durham, N.C. It is understood that the source 108 can be mounted in many different manners. By way of example, a source can be mounted to a planar surface or a pedestal can be provided for holding the source. The light source 108 can be mounted using many different known mounting methods and materials. The light source 108 can be thermally coupled to the heat sink structure 112 to allow heat from the light source 108 to dissipate through the heat sink structure 112.

LED lamps according to the present invention can have many different types of emitters that emit different wavelength spectrums of light. In some embodiments, a lighting unit according to the principles of the present invention emits light in two or more peak wavelengths, e.g., blue, yellow, and red. At least a first wavelength can be emitted by the solid state light source, such as blue light, and at least a second wavelength can be emitted by the wavelength conversion element, e.g., green and/or yellow light. Depending on the embodiment, a third wavelength of light, such as green and/or red light can be emitted by the solid state light source and/or the wavelength conversion element. Red LED chips can be more efficient than using a red wavelength conversion material such as a red phosphor. In some embodiments, the at least three wavelengths can be emitted by the wavelength conversion element or the solid state light source. In some embodiments, the solid state light source can emit overlapping, similar, or the same wavelengths of light as the wavelength conversion material. For example, the solid state light source can comprise LEDs that emit a wavelength of light, e.g. red light, that overlaps or is substantially the same as light emitted by phosphors in the wavelength conversion material, e.g., red phosphor added to a yellow phosphor in the wavelength conversion material.

In some embodiments, the solid state light source comprises at least one additional LED that emits light having at least one different peak wavelength of light, and/or the wavelength conversion material comprises at least one additional phosphor or lumiphor emitting at least one different peak wavelength. Accordingly, the lighting unit emits light having at least four different peak wavelengths of light. For example, embodiments of the present invention can also incorporate one or more sources emitting cyan light, or light having a wavelength of approximately 480-490 nm. Light in this wavelength is often missing from white light combinations emitted by prior art lamps, since the wavelength of such light can overlap with wavelengths absorbed by phosphors designed to absorb blue light and emit yellow or green light. Use of a cyan source can alleviate this problem.

In one embodiment eight or nine LEDs or more can be used that are connected in series with two wires to a circuit board. Any other combination of series and/or parallel connections is also possible. The wires can then be connected to the power supply unit described above. In other embodiments, more or less than eight or nine LEDs can be used and as mentioned above, commercially available LEDs from Cree, Inc. can used including eight XLamp® XP-E LEDs or four XLamp® XP-G LEDs. Different single string LED circuits are described in commonly assigned U.S. patent application Ser. No. 12/566,195, to van de Ven et al., entitled "Color Control of Single String Light Emitting Devices Having Single String Color Control," and commonly assigned U.S. patent application Ser. No. 12/704,730 to van de Ven et al., entitled "Solid State Lighting Apparatus with Compensation Bypass Circuits and Methods of Operation Thereof", each of which is fully incorporated by reference herein in its entirety. Other exemplary sources and source arrangements are described in commonly assigned U.S. patent application Ser. No. 13/034,501 to Le et al. and entitled "Solid State Lamp and Bulb," which is fully incorporated by reference herein in its entirety. Sources, including shaped sources, and the relationships between sources and phosphors and sources and encapsulants are described in commonly assigned U.S. patent application Ser. No. 13/770,389 to Sun et al. and entitled "LED Package with Multiple Element Light Source and Encapsulant Having Planar Surfaces," which is fully incorporated by reference herein in its entirety. Sources according to the present invention can include, for example, a dome-shaped or hemispheric encapsulant, a flat encapsulant, textured encapsulants, and/or other types of encapsulants, or no encapsulant at all. Many different source types are possible.

The materials which form the wavelength conversion element, which will be discussed in detail below, can sometimes be relatively expensive, which can make the conversion element one of the most expensive components of a device. Use of wavelength conversion elements according to the present invention in combination with multiple-source arrangements, such as sources comprising two or more LEDs, eight or more LEDs, nine or more LEDs, etc., can prove to be cost-effective due to having a higher output to conversion element material ratio.

The heat sink structure 112 can at least partially comprise a thermally conductive material, and many different thermally conductive materials can be used including different metals such as copper or aluminum, or metal alloys. Copper can have a thermal conductivity of up to 400 W/m-K or more. In some embodiments the heat sink can comprise high purity aluminum that can have a thermal conductivity at room temperature of approximately 210 W/m-K. In other embodiments the heat sink structure can comprise die cast aluminum having a thermal conductivity of approximately 200 W/m-K. The heat sink structure 112 can also comprise other heat dissipation features such as heat fins that increase the surface area of the heat sink to facilitate more efficient dissipation into the ambient. In some embodiments, the heat fins can be made of material with higher thermal conductivity than the remainder of the heat sink. In the embodiment shown the fins are shown in a generally vertically oriented, but it is understood that in other embodiments the fins can have a horizontal or angled orientation. In still other embodiments, the heat sink can comprise active cooling elements, such as fans, to lower the convective thermal resistance within the lamp. In some embodiments, heat dissipation from the wavelength conversion element 102 is achieved through convective thermal dissipation and/or conductive thermal dissipation through the heat sink structure 112.

All or some of the heat sink structure 112, such as the top surface 112a and/or the fins, can be reflective so as to reflect light that is internally reflected from a conversion element, diffuser, or other element. Some or all of these surfaces can, in some embodiments, be 95% reflective or higher. Different heat dissipation arrangements and structures are described in commonly assigned U.S. patent application Ser. No. 13/029,005 to Tong et al., and entitled "LED Lamp Incorporating Remote Phoshpor and Diffuser with Heat Dissipation Features," commonly assigned U.S. patent application Ser. No. 13/029,025, to Tong et al., and entitled "LED Lamp Incorporating Remote Phosphor with Heat Dissipation Features," and commonly assigned U.S. patent application Ser. No. 13/536,707 to LeToquin et al. and entitled "Compact High Efficiency Remote LED Module," each of which is fully incorporated by reference herein in its entirety, and U.S. patent application Ser. No. 13/034,501 to Le et al.

The heat sink structure 112 can also comprise features for connecting to a source of electricity such as to different electrical receptacles. In some embodiments the heat sink structure can comprise a feature of the type to fit in conventional electrical receptacles. For example, it can include a feature for mounting to a standard Edison socket, which can comprise a screw-threaded portion 114 which can be screwed into an Edison socket. In other embodiments, it can include a standard plug and the electrical receptacle can be a standard outlet, or can comprise a GU24 base unit, or it can be a clip and the electrical receptacle can be a receptacle which receives and retains the clip (e.g., as used in many fluorescent lights). These are only a few of the options for heat sink structures and receptacles, and other arrangements can also be used that safely deliver electricity from the receptacle to the lamp 100.

The lamps according to the present invention can comprise a power supply or power conversion unit that can comprise a driver to allow the bulb to run from an AC line voltage/current and to provide light source dimming capabilities. In some embodiments, the power supply can be housed in a cavity/housing within the lamps heat sink can comprise an offline constant-current LED driver using a non-isolated quasi-resonant flyback topology. The LED driver can fit within the lamp and in some embodiments can comprise a 25 cubic centimeter volume or less, while in other embodiments it can comprise an approximately 22 cubic centimeter volume or less and still in other embodiments 20 cubic centimeters or less. Lamps according to the present invention can also comprise a power supply or power conversion unit that is spatially and/or thermally isolated or remote to the source, which can reduce or eliminate the thermal impact of the module's source on the power supply elements and vice versa, which can allow for both to operate at lower temperatures. Such a power supply can be housed in a light fixture in a location that eliminates or reduces the thermal crosstalk between the source and power supply (such as in the base of the fixture), or the power supply can be remote (such as in a light's wall switch). Exemplary power supply arrangements are described in commonly assigned U.S. patent application Ser. No. 13/034,501 to Le et al. and Ser. No. 13/536,707 to LeToquin et al.

A diffuser 110 can be included over the wavelength conversion element 102. The diffuser 110 can be, for example, a glass dome designed to fit within the A19 bulb profile. In some embodiments, the diffuser 110 can be frosted so as to hide the wavelength conversion element 102 from view while still being transparent to light from the source 108, such as if the wavelength conversion element 108 is, for example, yellow. As further described below, the diffuser 110 can be arranged to disperse light from the wavelength conversion element 102 and/or source 108 into the desired lamp emission pattern, and can comprise many different shapes and sizes depending on the light it receives from the wavelength conversion element 102 and/or source 108 and the desired lamp emission pattern. Some examples of diffusers that can be used in embodiments of the present invention are described in U.S. patent application Ser. No. 13/029,005 to Tong et al., Ser. No. 13/034,501 to Le et al. and Ser. No. 13/536,707 to LeToquin et al. In some embodiments the wavelength conversion element 102, which will be discussed in detail below, can be designed to provide some or all of the necessary device diffusion, such that any shape of diffuser can be used and/or the diffuser can be designed for aesthetics as opposed to or in addition to functionality. Some embodiments of the present invention do not use a diffuser.

The wavelength conversion element 102 can be included and can be over the source 108. The element 102 can be designed and/or placed such that the phosphor portion 104 and the source 108 are coupled to one another using, for example, the filler portion 106, which can comprise, for example, a solid phase or fluid transparent optical material. When used in the present application, the term "solid phase" when referring to the filler portion refers to the phase of the filler portion (e.g., not a liquid or gas); the term "solid" when referring to the wavelength conversion element as a whole, on the other hand, refers to a material that is filled or not hollow (whether the filler material is solid phase or liquid phase, for example). It is understood that many different shapes, sizes, and types of wavelength conversion elements can be used, some of which will be described herein.

The wavelength conversion element 102 can be solid (i.e., "not hollow"; embodiments with a liquid filler portion 106 are described herein and are included in the definition of a "solid wavelength conversion element"). Embodiments of wavelength conversion elements according to the present invention can be characterized as comprising a conversion material and thermally conductive light transmitting material, but it is understood that wavelength conversion elements can also be provided that are not thermally conductive. The light transmitting material can be transparent to the light emitted from the light source 108 and the conversion material in the phosphor portion 104 can be of the type that absorbs the wavelength of at least some of the light from the light source 108 and re-emits a different wavelength of light. In the embodiment shown, the thermally conductive light transmitting material can be the filler portion 106 and the conversion material can be all or part of the phosphor portion 104 on the filler portion 106. As further described below, different embodiments can comprise many different arrangements of the thermally conductive light transmitting material and conversion material.

Many different phosphors can be used in the phosphor portion 104 with the present invention being particularly adapted to lamps emitting white light. As described above, in some embodiments the light source 108 can be LED based with at least some, and in some embodiments all, of the LEDs emitting light in the blue wavelength spectrum. The phosphor layer can absorb some of the blue light and re-emit yellow. This allows the lamp to emit a white light combination of blue and yellow light. In some embodiments, the blue LED light can be converted by a yellow conversion material using a commercially available YAG:Ce phosphor, although a full range of broad yellow spectral emission is possible using conversion particles made of phosphors based on the (Gd,Y)$_3$(Al,Ga)$_5$O$_{12}$:Ce system, such as the Y$_3$Al$_5$O$_{12}$:Ce (YAG). Other yellow phosphors that can be used for creating white light when used with a blue emitting LED based emitter include but are not limited to:

Tb$_{3-x}$RE$_x$O$_{12}$:Ce (TAG); RE=Y, Gd, La, Lu; or

Sr$_{2-x-y}$Ba$_x$Ca$_y$SiO$_4$:Eu.

The phosphor layer can also be arranged with more than one phosphor either mixed in with the phosphor portion 104 or as a second phosphor layer. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}S:Eu, Y; Y=halide$;
$CaSiAlN_3:Eu$; or
$Sr_{2-y}Ca_ySiO_4:Eu$

Other phosphors can be used to create color emission by converting substantially all light to a particular color. For example, the following phosphors can be used to generate green light:

$SrGa_2S_4:Eu$;
$Sr_{2-y}Ba_ySiO_4:Eu$; or
$SrSi_2O_2N_2:Eu$.

The following lists some additional suitable phosphors that can be used as conversion particles in phosphor portion 104, although others can be used. Each exhibits excitation in the blue and/or UV emission spectrum, provides a desirable peak emission, has efficient light conversion, and has acceptable Stokes shift:

Yellow/Green
$(Sr,Ca,Ba) (Al,Ga)_2S_4:Eu^{2+}$
$Ba_2(Mg,Zn) Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
$Lu_3Al_5O_{12}$ doped with $Ce^{3+}$
$(Ca,Sr,Ba) Si_2O_2N_2$ doped with $Eu^{2+}$
$CaSc2O4:Ce^{3+}$
$(Sr,Ba)2SiO4:Eu^{2+}$ Red
$Lu_2O_3:Eu^{3+}$
$(Sr_{2-x}La_x)(Ce_{1-x}Eu_x)O_4$
$Sr_{2-x}Ce_{1-x}Eu_xO_4$
$Sr_{2-x}Eu_xCeO_4$
$SrTiO_3:Pr^{3+}, Ga^{3+}$
$CaAlSiN_3:Eu^{2+}$
$Sr_2Si_5N_8:Eu^{2+}$ Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be provided in the phosphor portion 104 in a binder such as, for example, silicone, and the phosphor can also have different concentrations or loading of phosphor materials in the binder. A typical concentration can be in a range of 30-70% by weight, with some embodiments having a concentration of 50% or more and some other embodiments having a concentration of 60% or more or approximately 65%. In one embodiment, the phosphor is uniformly dispersed throughout the phosphor portion 104, although non-uniform embodiments are possible. The phosphor portion 104 can also have different regions with different conversion materials and/or different concentrations of conversion material.

The phosphor portion 104 can have many different thicknesses depending at least partially on the concentration of phosphor material and the desired amount of light to be converted by the phosphor portion 104. The phosphor portion 104 can have substantially the same thickness or varying thicknesses that in some embodiments can adjust to or vary the desired light color or emission pattern in the far field. The converter can comprise one or multiple layers of different phosphor materials, with some multiple layer arrangements described in commonly assigned U.S. patent application Ser. No. 13/029,063 to Hussell et al. and entitled "High Efficiency LED Lamp With Remote Phosphor and Diffuser Configuration," which is fully incorporated by reference herein in its entirety. The phosphor portion 104 can have, for example, a thickness of about 50 μm or more, about 10 mm or less, between about 50 μm and about 10 mm, between about 0.5 mm and about 2 mm, or approximately 1 mm, although thinner and thicker phosphor portions can be used. The phosphor portion 104 can be injection molded, although many different fabrication methods are possible. Exemplary phosphor portions include but are not limited to the MS-1002 Moldable Silicone and MS-1003 Moldable Silicone remote phosphor optics from Dow Corning®, Chromalit™ remote converters from Intematix®, and silicone remote phosphor products from NNCrystal.

While the above description refers to a phosphor portion 104 that occupies a three-dimensional space having a measurable thickness, it is understood that the phosphor portion can also be substantially two-dimensional, such as a coating on the outside surface of a filler portion. Some embodiments of phosphor portions can also include multiple sections, such as a three-dimensional carrier upon which a two-dimensional coating can be applied (although thicker three-dimensional coatings are also possible). One such example is a glass and/or silicone phosphor portion with a phosphor coating on its outside and/or inside surface. Alternatively, a phosphor portion could also be located within the filler portion. For example, an outer filler portion could surround a phosphor portion, which itself surrounds an inner filler portion. Many different placements of the phosphor portion are possible.

It is also understood that various additives such as, for example, scattering particles can be included in the phosphor portion 104 or the filler portion 106, or both, to uniformly or selectively adjust or vary the emission color or intensity in the far field to produce the desired emission properties. Different additives and/or scattering particles will be discussed in detail below.

Another potential additive for use in embodiments of the present invention is nanoparticles, which can be incorporated into a phosphor portion 104, filler portion 106, or both in order to more closely match the refractive indices of various materials, such as binder to phosphor particles, filler portion to binder, filler portion to phosphor portion, etc. It should be noted that the indices of refraction of these materials can be matched or more closely matched in embodiments not including nanoparticles. The use of nanoparticles is described in detail in commonly assigned U.S. patent application Ser. No. 12/151,089 to Chakraborty et al. and entitled "Encapsulation for Phosphor-Converted White Light Emitting Diode," which is fully incorporated by reference herein in its entirety. Yet another potential additive for use in embodiments of the present invention is quantum dots, such as quantum dots that emit red light. Quantum dots are discussed in detail in commonly assigned U.S. patent application Ser. No. 13/837,442 to Gupta et al. and entitled "Quantum Dot Narrow-Band Downconverters for High Efficiency LEDs," which is fully incorporated by reference herein in its entirety.

The filler portion 106 can be coincident with the upper and/or side surfaces of a source and/or be conformal with a source, whether the source is rectangular or shaped such as, but not limited to, those described in U.S. patent application Ser. No. 13/770,389. The filler portion 106 can serve to thermally couple the phosphor portion 104 to the source 108. In some embodiments, only one element (in this case the filler portion 106) is between the source 108 and the phosphor portion 104, although more elements can be intervening. The phosphor portion 104 can be directly on the filler portion 106 which can be directly on the source 108, although intervening elements are possible. The filler portion 106 can comprise many different materials with many different characteristics. The filler portion 106 can be, for example, a solid phase material, a liquid, or can alternate between the two during different periods of operation and/or non-operation, for example. Some exemplary materials are substantially or fully transparent in the visible wavelength spectrum. Some other exemplary materials can have a thermal expansion coefficient close to that of the source 108, although embodiments not having this property are possible, such as a silicone filler portion (which can have a CTE of about 250-350 ppm/K) with a higher CTE than a SiC—, GaN—, AlN—, or $Al_2O_3$-based source (which can have a CTE of about 3-6 ppm/K). In some embodiments, it can be beneficial to use a material with a workable melting temperature, such as a melting temperature of about 300° C. or under, such that the material can be poured (such as into the phosphor portion 104) during fabrication without damaging other materials such as, for example, the phosphor portion 104 and/or electronics in the lamp 100. The material can then optionally be hardened, such as by curing or cooling.

The filler portion 106 can also be made of the same material as or a similar material to the binder material within the phosphor portion 104, such as silicone. By using materials with the same or similar indices of refraction, light will be more likely to pass through the junction between the phosphor portion 104 and the filler portion 106 with limited or no losses and/or without being internally reflected. The filler portion 106 can be designed to have an index of refraction close to many different materials, such as a source encapsulant, the binder of the phosphor portion, the phosphor portion taken as a whole, and/or other materials. If a bonding agent is used to connect the filler portion 106 to, for example, the source 108, the bonding agent can have an index of refraction the same as or similar to the filler portion 106 and/or the source 108. Portions of optical elements according to the present invention can be integral with one another, which can also help reduce the amount of material interfaces, for example.

Many different materials can be used for the binder within the phosphor portion 104 and for the filler portion 106, with one preferred material being silicone, such as a silicone or similar organic oligomer or polymer having a thermal conductivity of about 0.1 W/m-K to about 0.2 W/m-K, although smaller and larger values are possible. Some suitable materials include silicones, epoxies, glass including organic and/or inorganic glass, dielectrics, BCB, polymides, polymers, ethyl cellulose, sol gel glass, polymeric materials, plastics, and hybrids thereof such as a glass/silicone hybrid, with one preferred material being silicone because of its high transparency and reliability in high power solid state lighting applications. Some inorganic or hybrid inorganic/organic glasses can have thermal conductivities of about 0.7 W/m-K to about 1.25 W/m-K, although smaller and larger values are possible. Some suitable phenyl- and methyl-based silicones are commercially available from Dow® Chemical. Materials can be cured using many different curing methods depending on different factors such as the type of material used. Different curing methods include but are not limited to heat, ultraviolet (UV), infrared (IR), or air curing. Some methods which can be used to form a conversion element and/or the phosphor portion and/or the filler portion are discussed in the commonly assigned applications U.S. Pat. No. 8,558,252 to Ibbetson et al. and entitled "White LEDs with Emission Wavelength Correction," and U.S. patent application Ser. No. 13/804,309 to Castillo et al. and entitled "LED Dome with Improved Color Spatial Uniformity," each of which is fully incorporated by reference herein in its entirety.

Wavelength conversion elements according to the present invention can also be used in conjunction with sources including encapsulants, such as but not limited to silicone encapsulants. In such embodiments, the filler portion can envelop and/or cover the encapsulant. In one such embodiment, the inner surface of the filler portion is coincident with the outer surface of the encapsulant. The filler portion can comprise the same material as the encapsulant, which can reduce or eliminate any losses and/or total internal reflection due to a difference in indices of refraction of the materials. For example, a silicone encapsulant can be enveloped or covered by a silicone filler portion.

Many different placements of a wavelength conversion element are possible. As best shown in FIG. 7, the wavelength conversion element 102 can be placed such that the phosphor portion 104 is remote to the source 108. The filler portion 106 can be on and/or directly on the source 108. In the embodiment shown, the phosphor portion 104 can be substantially frusto-spherical or globe-shaped, such that light emitted from the source 108 can pass through approximately equal lengths of the phosphor portion 104. Other such shapes, such as but not limited to a hemispheric shape, are also possible and will be discussed in detail below. These and similar shapes can define a bottom opening of the phosphor portion 104. The phosphor portion 104 can have an inner and/or outer diameter equal to or greater than the width of the source 102. In the case of multiple sources, the phosphor portion 104 can have an inner and/or outer diameter equal to or greater than the total width of the source array (e.g., from the left side of the left-most LED chip to the right side of the right-most LED chip). The base of a frusto-spherical wavelength conversion element 102 or other wavelength conversion element can have a width equal to or larger than the width of the source 108 and/or the total width of a source array. The phosphor portion in various embodiments of the present invention can be separated from the source by at least 0.1 mm, including ranges of 50 mm and larger, although smaller distances are also possible. Some embodiments include distances of about 0.5 mm to 25 mm, or about 2 mm to about 10 mm, or approximately 5 mm. In one embodiment, the wavelength conversion element 102 has a diameter of about 30 mm while the source has a width or diameter of approximately 14 mm. The above descriptions with respect to the frusto-spherical wavelength conversion element 102 and/or its spatial relationship to the source 108 also apply to other wavelength conversion elements which will be described in detail below (e.g., hemispherical elements, etc.).

The wavelength conversion element 102 can be secured in a number of ways. In one embodiment seen best in FIG. 7, the element 102 includes an attachment portion 102a which attaches to the heat sink 112, such as a male attachment portion 102a fitting into a groove 112b within the heat sink 112 as shown. Alternatively, for example if no attachment portion and groove are present, at least part of the bottom of the wavelength conversion element can be flush with the heat sink. The wavelength conversion element can be attached to the heat sink and/or the source using an adhesive which can be transparent and/or thermally conductive. As described above, the adhesive can have an index of refraction between that of the wavelength conversion element 102 and the source 108, and/or the same as or similar to that of the conversion element 102 and/or source 108. Many other attachment means are possible, including but not limited to threading and snapping.

Embodiments of the present invention, such as that seen in FIGS. 5-7 above and those described below, can have distinct advantages over prior art devices. Because light from a source may not pass through air, for example, before passing into another material such as the filler portion 106, the number of material interfaces can be reduced, resulting in higher extraction efficiency and lower loss. For example, in the embodiment described above with regard to FIGS. 5-7, light emitted from the source 108 can enter a silicone filler portion 106 and pass directly into the silicone binder of the phosphor portion 104, thus eliminating an air-silicone boundary and the associated losses experienced in prior art devices.

Figure 8:
FIG. 8 is a chart showing descriptions and photographs of embodiments of the prior art and the present invention.
Figure 8:
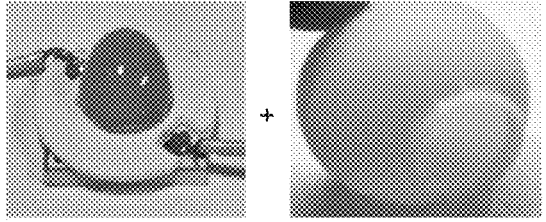
Figure 8:
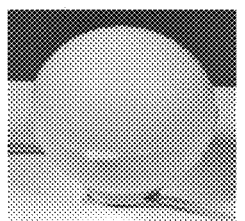
Figure 8:
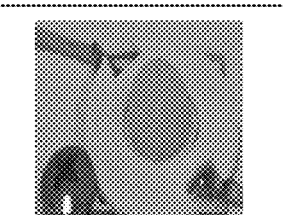
Figure 8:
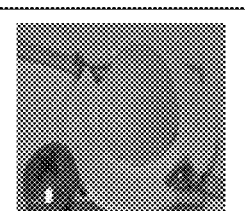
Figure 8:
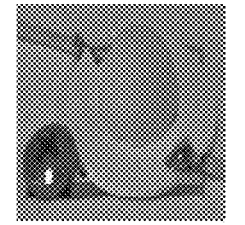

FIG. 8 is a chart showing descriptions and photographs of embodiments of the present invention and various prior art devices. Embodiments of the current invention shown in FIG. 8 include 1) a frustospherical optic filled with silicone 192, 2) a solid hemispheric glass optic coated with phosphor 194, 3) a solid hemispheric silicone optic coated with phosphor 196, and 4) a source with a clear flat encapsulant coated with phosphor 198.

Prior art devices including a hollow remote phosphor arrangement (such as, for example, an arrangement where the filler portion 106 in FIGS. 5-7 were replaced with air) have been shown to experience about a 10%-15% steady state efficacy (lumens per watt) increase over devices with phosphor coated directly on the source. Devices according to the present invention (including but not limited to that described above in FIGS. 5-7 and those described below) can experience an efficacy increase over these prior art devices. One reason this increase may occur is that systems according to the present invention can have improved system thermal conductivity. For example, heat generated by the phosphor when it converts the wavelength of light can be thermally conducted into the filler portion of the conversion element, from which it can be more efficiently dissipated, such as into the ambient or a heat sink. Experimental embodiments of the present invention corresponding to the devices 192,194,196,198 in FIG. 8 have shown luminous flux of 113.6%, 104.1%, 109%, and 101.7%, respectively, that of prior art "dam and fill" devices. Embodiments of the present invention have been measured at an efficacy of 200 lm/W. Such embodiments can use a combination of blue and red sources or exclusively blue sources, for example.

Embodiments of the present invention can also increase device longevity. For example, if phosphor particles are placed too near the source, they can degrade over time. By placing the phosphor particles remote to the source, the particles can operate effectively for a longer period of time.

Embodiments of the present invention can also have decreased losses over prior art devices due to a reduction in the number of material interfaces through which light must pass. For example, because light can pass directly from the source into the filler portion, light does not pass from the source into air before passing into, for example, a remote phosphor, as in the prior art. This eliminates the intermediate material (air), and the associated losses due to differences in indices of refraction. The phosphor portion can also comprise the same material as the filler portion (in addition to phosphor). In such an embodiment, unconverted light may only pass through one material (the filler portion material) before emission from the wavelength conversion element. This reduction in material interfaces can lead to higher efficacy and efficiency.

Figure 9:
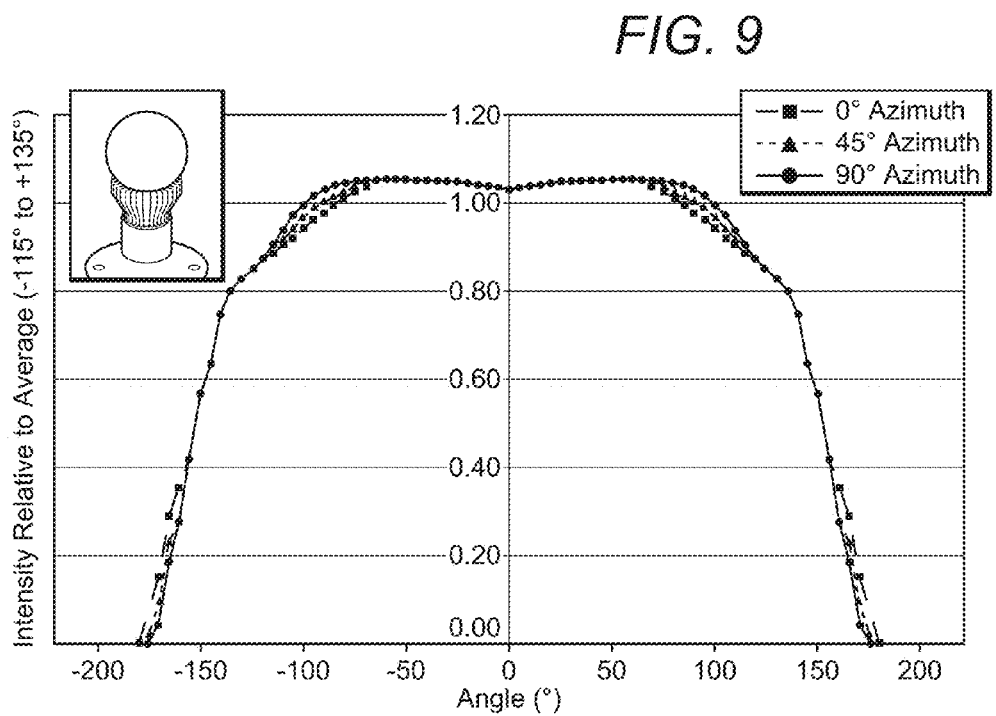
FIG. 9 is a graph of emission intensity vs. emission angle for a lamp according to one embodiment of the present invention.

Devices according to the present invention can be engineered to achieve a desired device emission profile such as, for example, the Department of Energy (DOE) Energy Star® defined omnidirectional distribution criteria. One requirement of this standard met by some lamps according to the present invention is that emission must be within 20% of the mean value from 0° to 135°, and greater than 5% of the total flux must be emitted from 135° to 180°, with the measurements taken at 0°, 45°, and 90° azimuthal angles. Different lamp embodiments herein can also comprise A-type retrofit LED bulbs that meet the DOE Energy Star® standards. For example, the emission profile of one embodiment of the lamp 100 is shown in FIG. 9. When the diffuser 110 is a simple glass dome shaped to fit within the A19 profile, the emission profile is energy compliant. The present invention provides lamps that are efficient, reliable, and cost effective. In some embodiments, the entire lamp can comprise five components (for example, diffuser, wavelength conversion element, source, heat sink, and attachment mechanism) that can be quickly and easily assembled.

Conversion elements according to the present invention can also have diffusive properties which can help achieve a desired device emission profile and/or help in color mixing. Diffusive properties of the conversion element can be provided by, for example, scattering particles in addition to the phosphor particles already present in a conversion element, which can have diffusive properties themselves. Different embodiments of packages according to the invention can comprise different types and arrangements of scattering particles or scatterers. Some exemplary scattering particles include:

- silica gel;
- zinc oxide (ZnO);
- yttrium oxide ($Y_2O_3$);
- titanium dioxide ($TiO_2$);
- barium sulfate ($BaSO_4$);
- alumina ($Al_2O_3$);
- fused silica ($SiO_2$);
- fumed silica ($SiO_2$);
- aluminum nitride;
- glass beads;
- zirconium dioxide ($ZrO_2$);
- silicon carbide (SiC);
- tantalum oxide ($TaO_5$);
- silicon nitride ($Si_3N_4$);
- niobium oxide ($Nb_2O_5$);
- boron nitride (BN); and
- phosphor particles (e.g., YAG:Ce, BOSE)

Other materials not listed may also be used. Various combinations of materials or combinations of different forms of the same material can also be used to achieve a particular scattering effect. For example, in one embodiment a first plurality of scattering particles includes alumina and a second plurality of scatting particles includes titanium dioxide. In other embodiments, more than two types of scattering particles are used. Scattering particles are discussed generally in the commonly assigned U.S. Pat. No. 7,999,283 to Chakraborty et al. and entitled "Encapsulant with Scatterer to Tailor Spatial Emission Pattern and Color Uniformity in Light Emitting Diodes," and U.S. patent application Ser. No. 11/895,573 to Chakraborty and entitled "Light Emitting Device Packages Using Light Scattering Particles of Different Size," each of which is fully incorporated herein by reference in its entirety.

Additionally, scattering particles can be dispersed in many different ways, such as in a phosphor portion, a filler portion, or both. For example, scattering particles can be included uniformly or non-uniformly in the phosphor portion of the conversion element along with the wavelength conversion particles. In embodiments where more side emission is desired, more scattering particles can be included in the upper portion of the phosphor portion, or in embodiments where more forward emission is desired more scattering particles can be included in the lower portion. In other embodiments, scattering particles can be arranged in three-dimensional regions of the conversion element. Commonly assigned U.S. patent application Ser. No. 12/498,253 to LeToquin and entitled "LED Packages with Scattering Particle Regions", which is fully incorporated by reference herein in its entirety, describes regions of scattering particles in encapsulants, which can be applied to the conversion element of embodiments of the present invention.

Wavelength conversion elements according to the present invention can have a smooth outer surface, which can simplify fabrication if a molding process is used. Alternatively, conversion elements can also have a fully or partially textured outer surface. The conversion elements can be textured in manners similar to those used to texture encapsulant surfaces. Methods and qualities of textured surfaces that can be used in embodiments of the present invention are described in commonly assigned U.S. patent application Ser. No. 12/002,429 to Loh et al. and entitled "Textured Encapsulant Surface in LED Packages," which is fully incorporated by reference herein in its entirety.

Embodiments of conversion elements and/or diffusers according to the present invention can be shaped for beam shaping. Some exemplary devices and methods for beam shaping are described in the commonly assigned applications U.S. patent application Ser. No. 13/544,662 to Tarsa et al. and entitled "Primary Optic for Beam Shaping" and U.S. patent application Ser. No. 13/842,307 to Ibbetson et al. and entitled "Low Profile Lighting Module," each of which is fully incorporated by reference herein in its entirety. More complex shapes and methods of forming these primary optics are described in U.S. Pat. No. 8,564,004 to Tarsa et al. and entitled "Complex Primary Optics and Methods of Fabrication," which is also commonly assigned and fully incorporated by reference herein in its entirety.

Figure 10A:
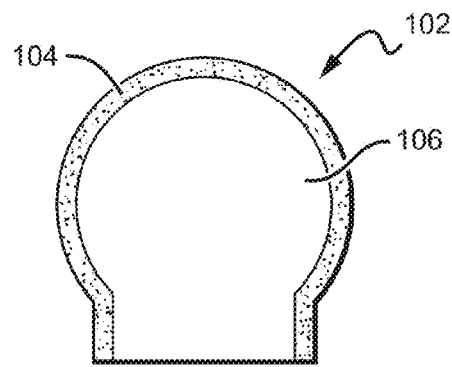
FIGS. 10A-10E are cross-sectional views of wavelength conversion elements according to embodiments of the present invention.
Figure 10B:
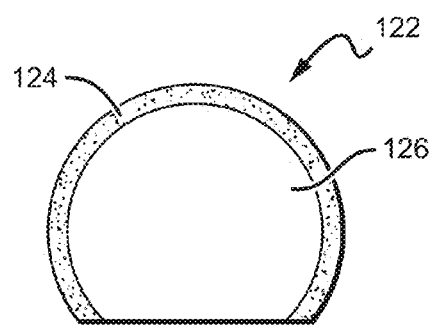
Figure 10C:
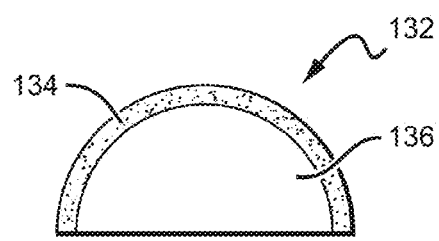
Figure 10D:
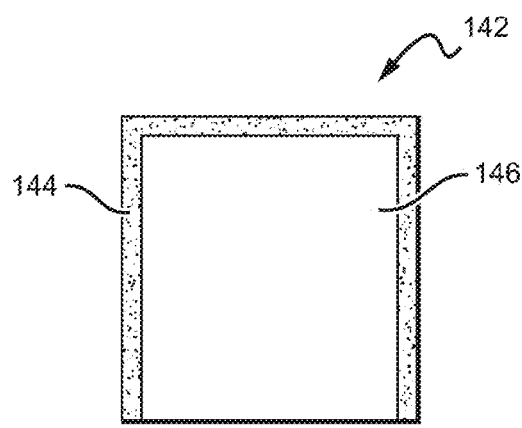
Figure 10E:
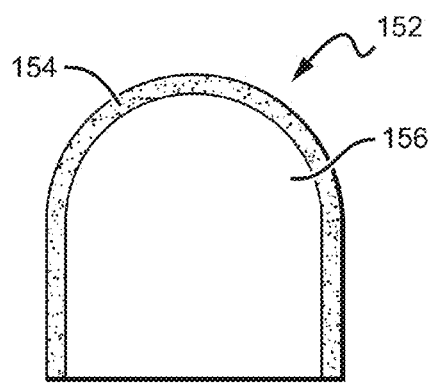

Conversion elements according to the present invention can also be shaped to help achieve a desired device emission profile. For example, the conversion element 102 in FIGS. 5-7 is frusto-spherical with an attachment portion 102a. Other embodiments of conversion elements according to the present invention can simply be frusto-spherical or globe-shaped, such as the conversion element 122 in FIG. 10B; hemispheric (including oblong hemispheric) such as the conversion element 132 shown in FIG. 10C; cylindrical, cubic, or rectangular prismatic such as the conversion element 142 in FIG. 10D; or bullet-shaped such as the conversion element 152 in FIG. 10E. Other embodiments include cubic conversion elements, conic conversion elements, inverted conic conversion elements, and other embodiments with polygon-shaped top or side cross-sections. Any shape including those described above can include an attachment portion such as a portion similar to that of the portion 102a in FIGS. 5-7. Wavelength conversion elements can have top cross-sections of polygons with 3, 4, 5, 6, 8, 10, 12, 16, or any other number of sides, and/or can have side cross-sections of polygons with 3, 4, 5, 6, 8, 10, 12, 16, or any other number of sides, some of these polygons including but not limited to equilateral and non-equilateral triangles, squares, rectangles, pentagons, hexagons, octagons, decagons, dodecagons, hexadecagons, and others. Some shapes which can be used with wavelength conversion elements according to the present invention are described with regard to encapsulants in commonly assigned U.S. patent application Ser. No. 13/902,080 to Lowes et al. and entitled "Emitter Package with Integrated Mixing Chamber," which is fully incorporated by reference herein in its entirety. Any of the above shapes can be inverted and used in some embodiments. Any of the conversion elements described above can be used with any of the embodiments described herein or portrayed in the attached figures in order to achieve a desired emission profile.

Figure 11:
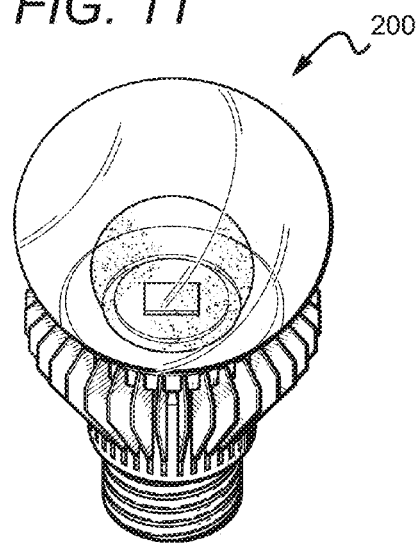
FIGS. 11 and 12 are perspective and cross-sectional views, respectively, of a lamp according to another embodiment of the present invention.
Figure 12:
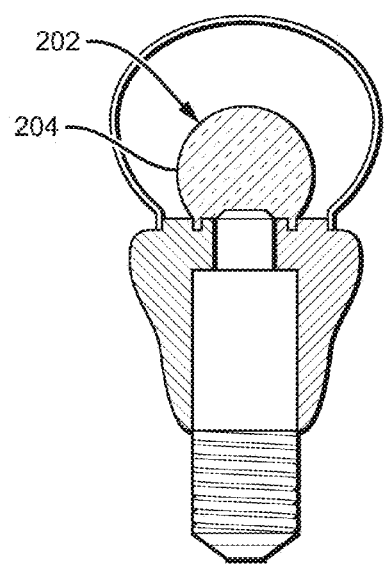

Embodiments other than that described in FIGS. 5-7 are possible. In the lamp 200 shown in FIGS. 11 and 12, the wavelength conversion element 202 can be made of a single solid material, such as by molding, which can be coated with a wavelength conversion material. The conversion element 202 can be, for example, a frusto-spherical element made of silicone. Wavelength conversion material 204 can be coated on the outside surface of the conversion element 202 using one or more of the methods described herein. The conversion element 202 can increase extraction efficiency since there are no material boundaries within the element, and can be easier to fabricate than a wavelength conversion element comprising two or more parts.

Figure 13:
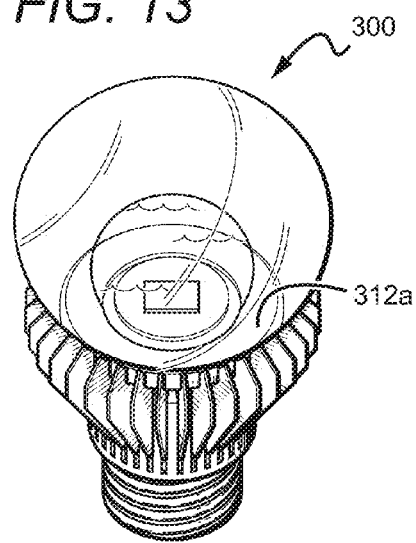
FIGS. 13 and 14 are perspective and cross-sectional views, respectively, of a lamp according to yet another embodiment of the present invention.
Figure 14:
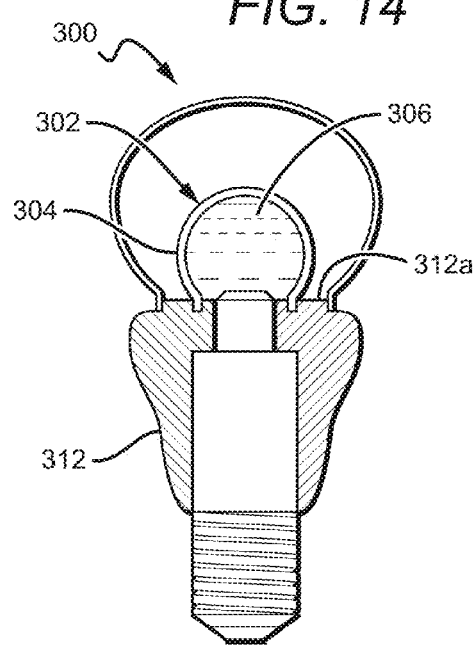

FIGS. 13 and 14 show another embodiment of a lamp 300 according to the present invention. The lamp 300 includes many of the same elements as the lamp 100 shown in FIGS. 5-7. However, the lamp 300 can include wavelength conversion element 302 that can include a phosphor portion 304 and a liquid and/or gel filler portion 306. The liquid filler portion 306 can include many different materials, including but not limited to silicone, siloxane, siloxane oils, mineral oils, perfluorinated polyether (PEPE), propylene carbonate, a fluorinated and/or halogenated liquid, water, and/or other thermally stable and/or chemically compatible substances. Some suitable PEPE-based materials are commercially available, for example, from Solvay Solexis S.P.A. of Italy. The material can be inert and/or not readily decompose. The material can be a liquid, gel, or other material that can be either moderate to highly thermally conductive, moderate to highly convective, or both. In some embodiments, the material can comprise a non-gaseous, formable material.

Some liquids that can be used will have a relatively low to moderate coefficient of thermal expansion, and/or will have a coefficient of thermal expansion that substantially matches that of one or more other components in the lamp, such as the source. The use of materials with such coefficients of thermal expansion can minimize stress on the phosphor portion and/or other components.

In some embodiments, the liquid filler portion 306 may be less thermally conductive than a solid filler portion. However, a liquid filler portion, including but not limited to those that are less thermally conductive than a solid filler portion, can also dissipate heat through convection in addition to conduction. This can result in a device with thermal dissipation characteristics near, equal to, or greater than a device with a solid phase filler portion. The wavelength conversion element 302 can be attached to the rest of the lamp 300, such as to the heat sink 312 and/or mount surface 312a, so as to retain the liquid filler portion 306. Optical liquids are discussed in detail in U.S. patent application Ser. No. 13/607,300 to Progl et al. and entitled "Lamp with Remote LED Light Source and Heat Dissipating Elements," which is fully incorporated by reference herein in its entirety.

Figure 15A:
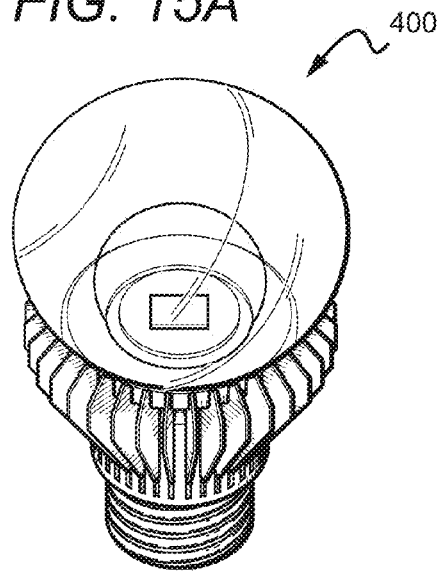
FIGS. 15A and 16A are perspective and cross-sectional views, respectively, of a lamp according to yet another embodiment of the present invention.
Figure 16A:
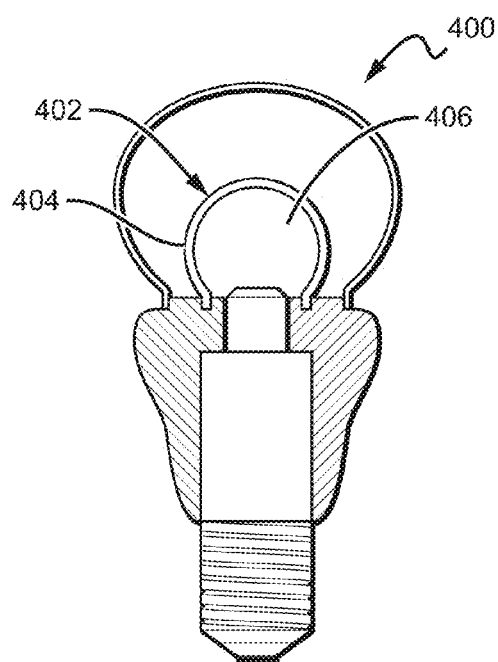
Figure 15B:
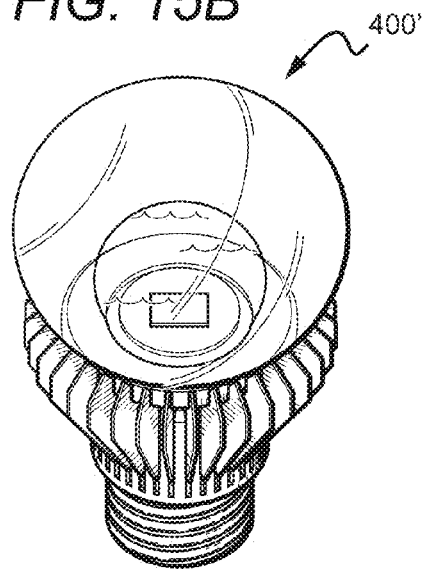
FIGS. 15B and 16B are another perspective view and cross-sectional view, respectively, of the lamp shown in FIGS. 15A and 16A.
Figure 16B:
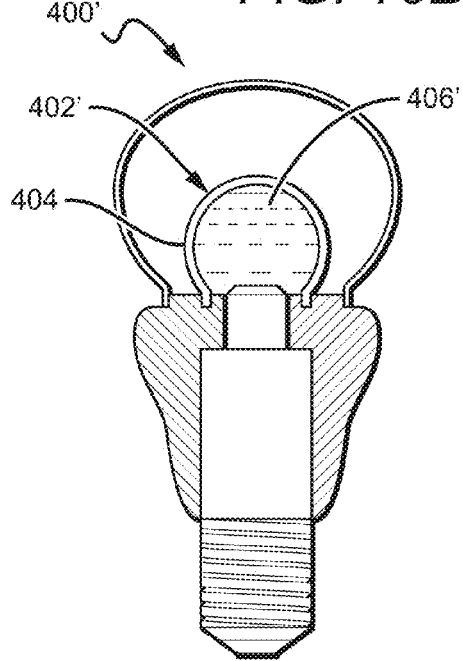

FIGS. 15A-16B show another embodiment of a lamp 400 according to the present invention, with FIGS. 15A and 16A showing the lamp 400 in an off state and FIGS. 15B and 16B showing the lamp 400 while operating or in an on state. The lamp 400 can include a filler portion 406 that can be solid phase when the lamp 400 is in an off state and can be liquid when the lamp is operating, as shown by indicator 406' in FIGS. 16A and 16B. The change of phase can be near instantaneous upon the activation of the source 408, or can occur within a matter of milliseconds, seconds, or longer. For example, in high power applications where lights are intended to remain on for extended periods of time such as days, weeks, months, or longer, including, for example, warehouse high bay fixtures, the change of phase may take several minutes or longer. The time required for the change of phase can be dependent on the material used for the filler portion 406/406' and/or the volume of the filler portion 406/406'. The filler portion 406 can include many different materials, including but not limited to glass with a low melting temperature such as 40° C. or below, 50° C. or below, or between about 85° C. and 150° C. Some such materials are described in Menaa et al., "Polycarboxylic Acids as Network Modifiers for Water Durability Improvement of Inorganic-Organic Hybrid Tin-Silico-Phosphate Low-Melting Glasses," J. of Solid State Chem. 179 (2006), 492-499; and Niida et al., "Preparation and Structure of Organic-Inorganic Hybrid Precursors for New Type Low-Melting Glasses," J. of Non-Crystalline Solids 306 (2002) 292-299, each of which is fully incorporated by reference herein in its entirety. Other possible materials include chloromethane, alcohol, methylene chloride, and/or trichloromonofluoromethane. One possible material is Fluorinert™, manufactured by the 3M Company. Some suitable materials are described, for example, in U.S. patent application Ser. No. 13/607,300. The lamp 400 can have the advantage of having a filler portion 406 with high thermal conductivity while also benefiting from convective heat dissipation during operation.

Figure 17:
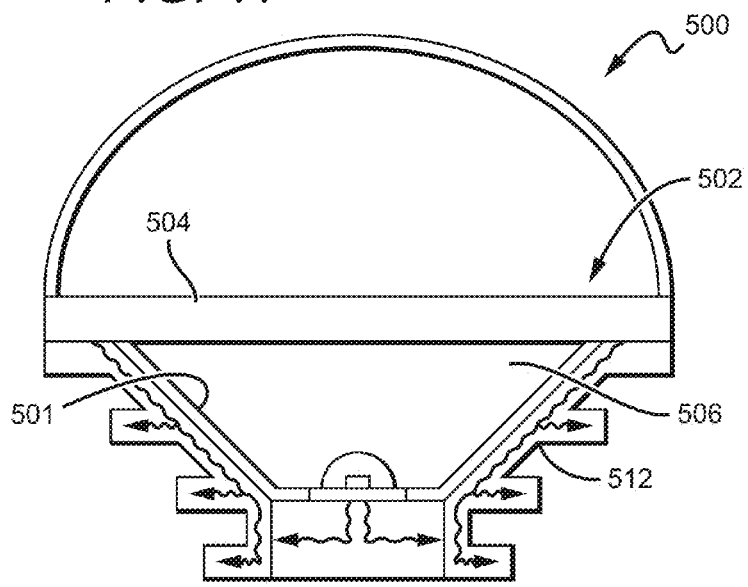
FIG. 17 is a cross-sectional view of a lamp according to yet another embodiment of the present invention.

Embodiments of the present invention can also include wavelength conversion elements that are not necessarily one of the three-dimensional shapes shown and described above, but that can be flat and/or planar and/or fill an optical cavity. For example, FIG. 17 shows an embodiment of a lamp 500 according to the present invention with a wavelength conversion element 502 that can fill an optical cavity 501. In the embodiment shown, the conversion element 502 can be partially or wholly surrounded by a heat sink and/or reflective cup 512, and can include a phosphor portion 504 and a filler portion 506. While in the embodiment shown the phosphor portion 504 rests on top of the heat sink structure 512, in other embodiments the phosphor portion 504 can be within the cavity 501 and/or have a top surface flush with or above that of the heat sink structure 512. The wavelength conversion element can include any combination of the materials described above with relation to wavelength conversion elements.

Figure 18:
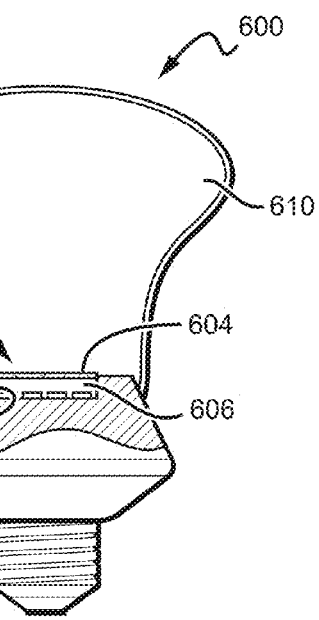
FIG. 18 is a cross-sectional view of a lamp according to yet another embodiment of the present invention.

FIG. 18 shows an embodiment of a lamp or bulb 600 according to the present invention that includes an optical cavity 601 with a wavelength conversion element 602 that can be deposited therein. The lamp 600, as with any of the embodiments described herein, can include a shaped diffuser 610 and an optical cavity 601. A wavelength conversion element 602 can fill the cavity 601 and include a phosphor portion 604 on a filler portion 606. As described above with regard to FIG. 17, the phosphor portion 604 can rest on top of the heat sink structure 612, can be within the cavity 601, and/or can have a top surface flush with or above that of the heat sink structure 612.

Embodiments of the present invention can also include composite shapes and/or shapes that combine two or more other shapes, such as but not limited to the shapes described above. For example, the lamp 700 in FIGS. 19 and 20 can include a wavelength conversion element 702. The element 702 includes a first portion 702a that fills an optical cavity 701, and a second frusto-spherical portion 702b that can be similar in shape to the conversion element 102 from FIGS. 5-7. In the embodiment shown, the conversion element 702 can include an outer phosphor portion 704 and a filler portion 706 which can include part or all of the first portion 702a and the inner part of the second portion 702b. In another embodiment, one portion of a conversion element (such as the second portion 702b) can have conversion material distributed uniformly therein, and another portion (such as the first portion 702a) can provide separation between the phosphor in the portion 702b and the source 708.

Embodiments of the present invention can include sources that are not mounted on a heat sink and/or are not coplanar, such as one or more solid state emitters mounted on a pedestal. Some such fixtures are described in detail in U.S. Pat. No. 8,562,161 to Tong et al. and entitled "LED Based Pedestal-Type Lighting Structure," and U.S. patent application Ser. No. 13/607,300 to Progl et al. and entitled "Lamp with Remote LED Light Source and Heat Dissipating Elements," each of which is fully incorporated by reference herein in its entirety.

FIGS. 21 and 22 show perspective and cross-sectional views of a lamp 800 according to the present invention that includes one or more sources 808 on a pedestal 820. The one or more sources can be approximately equidistant to some or all parts of the phosphor portion 804 of the wavelength conversion element 802, and/or the one or more sources 808 can be approximately at the center of the wavelength conversion element 802 and/or the phosphor portion 804. The filler portion 806 can envelop and/or cover the source 808 and/or the pedestal 820. The pedestal 820 can be thermally conductive, and in one embodiment can be more thermally conductive than the surrounding filler portion 806, in order to increase heat dissipation. Lamps including an elevated source can have increased high angle emission, including emission near, at, or over 180° (in this embodiment, perpendicular to a central axis of the pedestal 820). The combination of the elevated source 808 and a conversion element 802, which can have diffusive properties as described above, can further increase high angle light emission and/or make the emission of the lamp 800 more omnidirectional, the combination thereof producing a symbiotic effect in some embodiments. In some embodiments, a pedestal can include a heat pipe as described in U.S. patent application Ser. No. 13/607,300.

While the embodiment shown in FIGS. 21 and 22 shows a pedestal with one or more sources mounted thereon, other pedestal-type objects are possible, including but not limited to reflective optics. Some examples of optics which can be used in embodiments of the present invention, some of which can increase the omnidirectionality of lamp emission when used in combination with a coplanar source, are described in U.S. patent application Ser. No. 13/758,763 to Leung et al. and entitled "Solid State Lamp with Light Directing Optics and Diffuser," which is fully incorporated by reference herein in its entirety.

Figure 23:
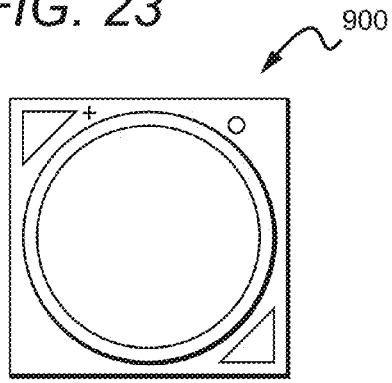
FIG. 23 is a top view of a source which can be used in embodiments of the present invention.

Wavelength conversion elements according to the present invention can be incorporated into any type of LED lighting fixture including but not limited to bulbs, lamps, low-bay and high-bay fixtures, troffers, and other fixtures. For example, conversion elements according to the present invention can be incorporated into low-bay lights, high-bay lights, and troffers. FIG. 23 is a top view of one example of a light emitting element 900 which can be used in embodiments of the present invention. Specifically, FIG. 23 shows a Cree® XLamp® CXA2520 LED array. This is one example of an LED array that can be used as a light source in the present invention, with this particular array delivering high lumen output and high efficacy. Other Cree® arrays can be used in the present invention, including but not limited to the XLamp® CXA 1520 high density LED array. The data sheet of the CXA1520 and the data sheet of the CXA2520 are each incorporated herein by reference in their entirety. Other Cree® products can be used in embodiments of the present invention, including but not limited to: CXA1507, CXA1512, CXA2011, CXA2530, MC-E, MK-R, ML-B, ML-C, ML-E, MP-L, MT-G, MT-G2, MX-3, MX-6, XB-D, XM-L, XM-L2, XP-C, XP-E, XP-E2, XP-G, XP-G2, XR-C, XR-E, and XT-E. Any other type of high intensity emission LED is also suitable for use in the present invention. (See e.g., Cree® LED components and modules products webpage, available at http://www.cree-.com/led-components-and-modules/products). It is understood that other types of LEDs and light emitting devices not mentioned herein can also be used in this and other embodiments of the present invention.

Figure 24:
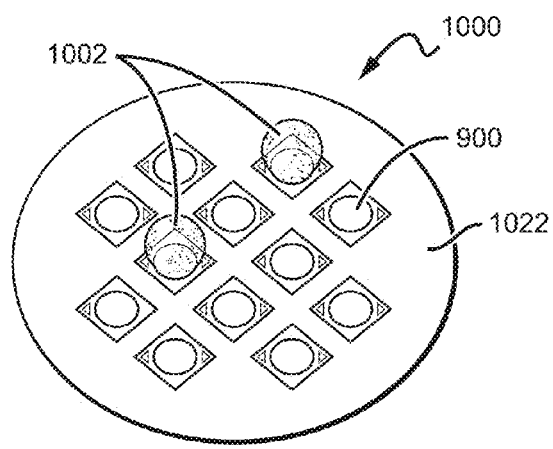
FIG. 24 is a top perspective view of a source which includes a plurality of the sources from FIG. 23 which can be used in embodiments of the present invention.

FIG. 24 shows a device 1000 wherein the individual light emitting elements 900 mounted on a common light emitting element holder or submount 1022. The device 900 can include wavelength conversion elements 1002, such as but not limited to any of the conversion elements described herein, mounted over the arrays 900. While FIG. 24 shows conversion elements 1002 mounted over only two arrays for display purposes, it is understood that conversion elements can be mounted over one or more of the arrays, including all of the arrays. Further, in one embodiment a single large conversion element over a plurality of arrays can also be used instead of a conversion element for each array.

Figure 25:
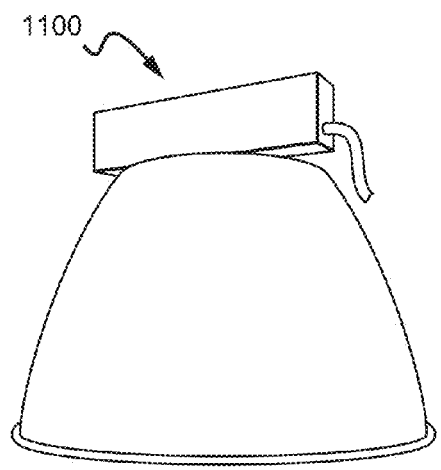
FIGS. 25 and 26 are a side perspective and a bottom view of a fixture according to an embodiment of the present invention.
Figure 26:
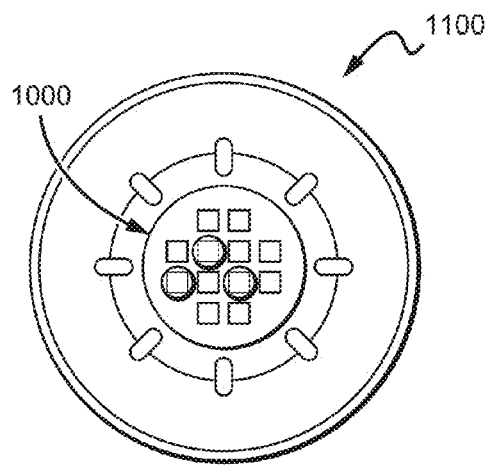

FIGS. 25 and 26 show a side perspective view and a bottom view of a high-bay fixture 1100 incorporating the device 1000. The fixture 1100 can be used in applications where high intensity light sources are needed. Low and high bay fixtures which can comprise conversion elements according to the present invention are described in detail in commonly assigned U.S. patent application Ser. No. 13/840,887 to Van de Ven et al. and entitled "Aluminum High Bay Design," which is fully incorporated by reference herein in its entirety. Fixtures such as troffers can also comprise conversion elements and packages according to the present invention; such fixtures are described, for example, in commonly assigned U.S. patent application Ser. No. 13/828,348 to Edmond et al. and entitled "Door Frame Troffer," which is fully incorporated by reference herein in its entirety. Further, in applications where an indirect troffer may normally be desirable for color mixing purposes, the diffusive properties of some embodiments of conversion elements according to the present invention may instead allow for the use of direct lighting troffer and can achieve similar color mixing.

Conversion elements according to the present invention can be fabricated in many different ways. In a first embodiment of a method for fabricating the conversion element 102 from FIGS. 5-7, the phosphor portion 104 can be injection molded and fully or partially cured; methods involving partial curing will be discussed in detail below. In some embodiments, non-solid/hollow portions such as the frustospherical phosphor portion 104 can be shaped through its own elasticity. For example, phosphor portion material can retract inwards, such as after being removed from a mold, to form the bottom/inward-tapering section of the frustosphere.

Liquid can be poured into the phosphor portion 104 and cured to form the filler portion 106. Alternatively, in some embodiments the liquid can be allowed to cool and harden. In another embodiment, both the phosphor portion 104 and the filler portion 106 can be injection molded. For example, the phosphor portion 104 can be injected molded, and then the filler portion 106 can be added to the mold within the phosphor portion 104.

In another method for forming the conversion element 102, a solvent-phosphor-binder mixture can be sprayed on a filler portion. The mixture can then be cured and/or the solvent can be dissolved. Potential solvents include but are not limited to toluene, benzene, zylene, and OS-20 commercially available from Dow Corning®. Different concentrations of solvent can be used.

In another method, phosphor can be attached through an emersion process whereby a phosphor coating can be formed on the inside or outside surface of a carrier. The carrier can be wholly or at least partially filled or otherwise brought into contact with a phosphor mixture that adheres to the surface of the carrier. This can be particularly applicable to forming a coating on the inside surface of a carrier, but can also be used to deposit a coating on the outside surface of a filler portion such as in the conversion element 202 in FIGS. 11 and 12. The mixture can then be drained from the carrier, leaving behind a layer of the phosphor mixture on the surface which can then be cured if necessary. In one embodiment, the mixture can comprise polyethylene oxide (PEO) and/or one of the solvents discussed above in combination with one or more phosphors. The carrier can be filled and then drained, leaving behind a layer of the PEO (or solvent)/phosphor mixture, which can then be heat cured. The PEO or solvent can evaporate or be driven off by, for example, the heat, leaving behind a phosphor layer. In some embodiments, a binder can be applied to further fix the phosphor, while in other embodiments the phosphor can remain without a binder. The phosphor layers can also be applied both on the inside and outside of the carrier, and can have different types having different thickness in different regions of the carrier. In still other embodiments different processes can be used such as coating the carrier with a sheet of phosphor material that can be thermally formed to the carrier.

In some embodiments, the filler portion can be liquid during fabrication, and may optionally be hardened at a later stage. In one such method of fabricating a lamp according to the present invention, a liquid filler portion is poured into a solid phosphor portion. The phosphor portion can be shaped to define a cavity that can hold the liquid filler portion. The liquid filler portion can completely fill or almost fill the solid phosphor portion. One or more other lamp components can then be attached to the wavelength conversion element. For example, a mount surface with a source mounted thereon can be inverted or upside-down, and/or attached to the wavelength conversion element using any of the attachment means described above, such as an adhesive. During this process, the source and/or part of the heat sink may enter the liquid-filled cavity. Any excess liquid can then exit the cavity to make room for the source and/or part of the heat sink. This and similar processes can ensure that the entire volume between the solid phosphor portion and the mount surface is filled by the filler portion, and can therefore reduce and/or eliminate air pockets. These methods can ensure that the filler portion is directly on part of or, in a preferred embodiment, the entire emitting surface of the source. The lower edge of the filler portion can be coincident with the upper and/or side surfaces of the source. These methods can ensure that light passes through the smallest number of material interfaces possible, increasing efficacy and efficiency. The filler portion can then optionally be hardened, such as by cooling and/or curing, can remain liquid, or can be temporarily hardened in the case of a phase-changing filler portion. While the above method refers to a liquid filler portion, it is understood that this method could be used with any filler portion where excess material can be removed, such as by insertion of the source and/or mount surface into the area previously occupied by the filler portion. This includes, for example, gel filler portions, and solid-phase filler portions, for which the wavelength conversion element need not be inverted during attachment of the conversion element to the mount surface.

In an alternative method of maintaining a low volume of or no air within the phosphor portion, material can be injected through the phosphor portion into the cavity therein to fill any air pockets. In one such embodiment, the phosphor portion can already be attached to other components of a package, such as a substrate with a source mounted thereon. The phosphor portion can then be sealed if necessary, and the filler portion optionally hardened.

The above methods can be applied to filler portions comprising low-melting temperature glass, where a phosphor portion (such as a regular glass or silicone phosphor portion) can withstand the temperature of the glass in liquid form. In another method, a small amount of additive can be added to the phosphor portion to raise the melting temperature such that a liquid filler portion is at a temperature at least slightly lower than the melting temperature of the phosphor portion. Any of the above methods can be adapted for embodiments comprising a pedestal, such as the pedestal 820 from FIGS. 21-22. For example, the pedestal could be attached to a mount surface before placement into the liquid-phase filler portion.

Figure 19:
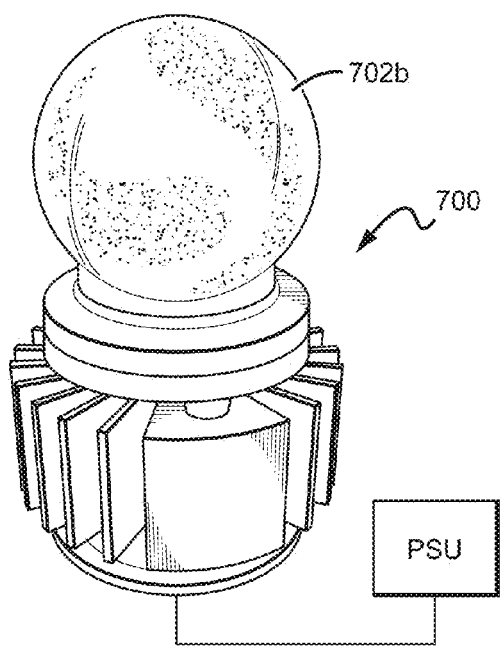

In some embodiments of the present invention, such as embodiments with a composite conversion element such as the element 702 in FIGS. 19 and 20, different portions of a conversion element, phosphor portion, and/or filler portion can be formed at different times and/or using different methods. As one example, the first portion 702a can be poured into the optical cavity 701 and cured or partially cured as will be described in detail below, and the second portion 702b can be fabricated using any of the methods described above. Other composite fabrication methods are possible. The different composite pieces can be integral with one another.

Other phosphor deposition methods include spraying, immersion, spin coating, sputtering, printing, powder coating, electrophoretic deposition (EPD), electrostatic deposition, and others. Various deposition methods and systems which can be used in devices according to the present invention are described in commonly assigned U.S. patent application Ser. No. 12/717,048 to Donofrio et al. and entitled "Systems and Methods for Application of Optical Materials to Optical Elements," which is fully incorporated by reference herein in its entirety.

Wavelength conversion elements according to the present invention can be formed in place over one or more sources as with a mold, or can be fabricated separately and then subsequently attached to other package components by an adhesive epoxy, for example. If an encapsulant includes different sections, such as the conversion element 702 in FIGS. 19 and 20, different portions can be attached at different times. For example the second portion 702b can be attached after the first portion 702a has finished curing through fuse molding, can be attached after the first portion 702a is partially cured as will be described in detail below, or can be attached at the same time through molding. One large mold can be used to form many conversion elements or parts thereof over many sources on a wafer, as with overmolding. The entire conversion element or portions of the conversion element may be applied with a pin-needle dispense method. In another embodiment, an ink jet may be used. Other dispense tools are also possible. Some conversion elements portions may be allowed to develop their shape using only gravity while they are cured, while some other portions may develop their shape through both gravity and other processes. Many different curing methods can be used, including but not limited to heat, ultraviolet (UV), and infrared (IR). Methods for attaching elements such as conversion elements to or forming a conversion element on a surface are discussed in the commonly assigned applications U.S. Pat. No. 8,558,252 to Ibbetson et al. and entitled "White LEDs with Emission Wavelength Correction" and U.S. patent application Ser. No. 13/804,309 to Castillo et al. and entitled "LED Dome with Improved Color Spatial Uniformity."

Figure 27A:
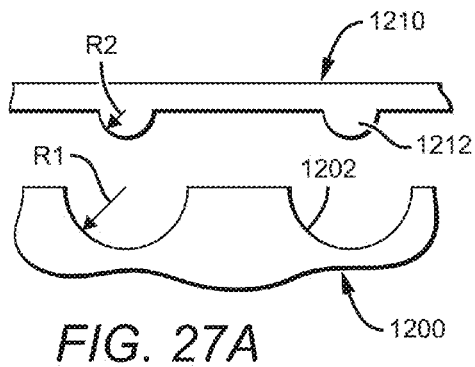
FIGS. 27A-27G show various stages of a method for forming a package according to one embodiment of the present invention.

One particular method according to the present invention for forming optical elements according to the present invention is shown in stages in FIGS. 27A-27G. FIG. 27A shows a typical mold 1200 having mold cavities 1202, such as a mold available from TOWA of Japan. It is understood while FIGS. 27A-27G and other figures are shown as having two or more mold cavities and/or as being adapted for the formation of two or more optical elements at one time, all methods described herein can be easily adapted for the formation of a single optical element or three or more optical elements. In a prior art process, the mold cavities 1202 are filled with an encapsulating material, and a wafer populated with emitters is pressed into the mold such that the emitters are properly positioned within the encapsulating material. The encapsulating material can then be cured.

The method shown in FIGS. 27A-27G can utilize an embossing plate 1210, as shown in FIG. 27A. The embossing plate 1210 can have one or more protrusions 1212. Each of the protrusions 1212 can have dimensions smaller than that of its corresponding mold cavity. In the specific embodiment shown, the protrusions 1212 have a radius R2 less than the radius R1 of the mold cavities 1202. While the embodiment shown in FIGS. 27A-27G shows hemispheric mold cavities 1202 and protrusions 1212, many different shapes are possible, including but not limited to those discussed below. The mold cavities can be inverted and/or upside-down such that the area of the mold cavity corresponding to the top of the optical element to be formed is at the bottom of the cavity.

Figure 27B:
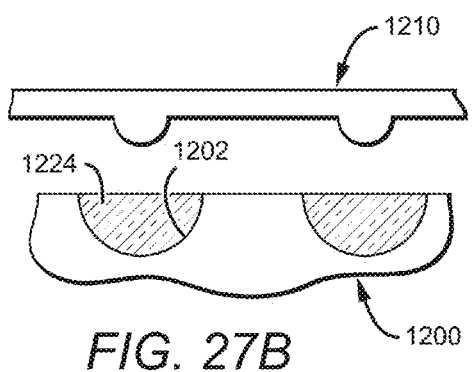

In a first step shown in FIG. 27B, the mold cavities 1202 can be filled with a first material 1224. As an example, the first material 1224 can be the same or similar to the material used for layer 134 shown in FIG. 10C, such as a silicone material with phosphor particles dispersed therein, and/or can be a material for forming any of the phosphor portions previously described. The first material 1224 can be in uncured form and/or below 50% cured. The first material 1224 can be a material that will eventually form a phosphor portion according to the present invention, as described in the previous embodiments. Many different materials are possible, including those discussed above with regard to FIGS. 1-26 and those that will be discussed in detail below.

Figure 27C:
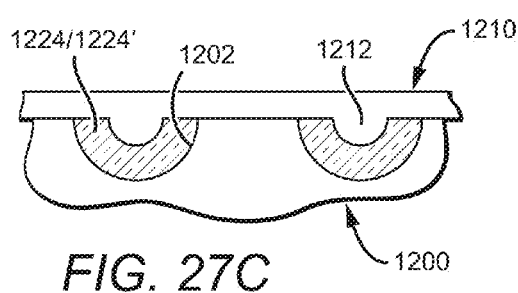

In second and third steps shown in FIG. 27C, the protrusions 1212 of the embossing plate 1210 can be pressed into the mold cavities 1202 and the first material 1224. The embossing plate 1210 can be shaped such that when the protrusions 1212 are pressed into the mold cavities 1202 and the first material 1224, the first material 1224 takes its approximate final shape. The first material 1224 can then be partially cured (as indicated by numbers followed by a "prime" symbol in FIGS. 27A-28G), such as through compression, heat, or a combination thereof. In one embodiment, the mold 1200 can be at temperature so as to aid in curing materials therein. Other curing methods are possible, including but not limited to UV curing, IR curing, and/or room temperature vulcanization. While embodiments herein refer to materials as being partially cured, in other embodiments the material can be viscous and/or maintain its shape, such as maintaining its shape such that it does not mix with and/or is separate and/or distinct from another material on, directly on, and/or in contact with the first material.

Methods according to the present invention can include stage-curing, in which different portions of material are cured at different times and/or at different rates. The first material 1224' can be only partially and not completely cured. For example, partial curing can mean that a material, in this case the first material 1224', can be about 50% cured to about 90% cured, about 60% cured to about 80% cured, or about 70% cured. The material can be cured to the point that it does not flow and/or maintains its shape, but is not necessarily solid. The material can remain tacky and/or gelatinous. In a preferred embodiment, the material (such as the first material 1224') can be cured to a point where chemically active bonding sites remain available and/or there is no complete crosslink between bonds. In one embodiment, the mold is provided at a temperature capable of curing material such that curing begins once material is poured into the mold.

Figure 27D:
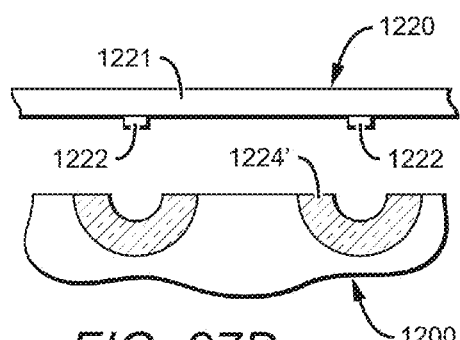
Figure 27E:
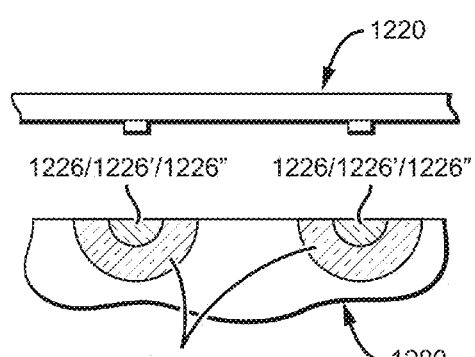

After partial curing, the embossing plate can be removed as shown in FIG. 27D. As shown in FIG. 27E, the unoccupied section(s) of the molding cavities 1202 can be filled with a second material 1226. In the specific embodiment shown the second material 1226 can correspond to, for example, layer 136 from FIG. 10C, or a filler portion as described in previous embodiments. In this embodiment the second material 1226 can be designed to be in direct contact with an emitter, in direct contact with a primary emission surface of the emitter, and/or in direct contact with the entire emitting surface of the emitter, although other embodiments are possible. The second material 1226 can comprise, for example, silicone, although many other materials are possible.

Figure 27F:
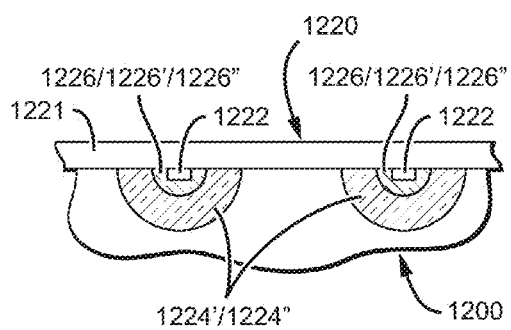
Figure 27G:
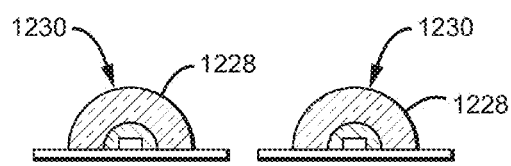

In one possible next step, a panel or wafer 1220 of emitters 1222 mounted on a common substrate 1221 can be provided. While the embodiment shown in FIGS. 27A-27G is adapted for production of more than one package simultaneously, it can easily be adapted for single package production. The wafer 1220 can be placed such that the emitters 1222 are in contact with, immersed in, surrounded by, and/or are partially or fully pressed into the second material 1226, as shown in FIG. 27F. The wafer 1220 (or substrate, in a single-package embodiment) can be in contact with the first material 1224 and/or the second material 1226, and/or can be flush with the materials 1224,1226. The materials 1224,1226 can continue curing and either continue or begin curing, respectively. By using this method, any air bubbles between the emitters 1222 and the second material 1226 can be reduced or eliminated, and/or a smooth interface between each emitter 1222 and the surrounding material can be formed. These materials can be cured until both materials 1224",1226" are completely cured (as indicated by numbers followed by a "double prime" symbol in FIGS. 27A-28G). Alternatively, in a method where a third material is to be deposited (not shown), the material 1226' can only be partially cured such that another material can be introduced which can form a chemical bond with the material 1226', as will be discussed below. The wafer 1220 can be singulated to form individual packages 1230, as shown in FIG. 27G.

Because the material 1224' can be only partially cured when the material 1226 is introduced, a chemical bond can form between the two materials 1224,1226, unlike prior art methods where only a mechanical bond is formed. Interfaces where a chemical bond is present, such as the interface between the materials 1224",1226", can have superior optical and mechanical properties compared to solely mechanical interfaces. For example, light passing through this interface will experience a smooth transition between materials, whereas mechanical bonds may contain, for example, air bubbles. In another embodiment of the present invention where the first material 1224 is fully cured before introduction of the second material 1226, the first material can be plasma-treated and/or exposed to UV light in order to activate available bonding sites and/or partially "uncure" part or all of the first material 1224.

Figure 28A:
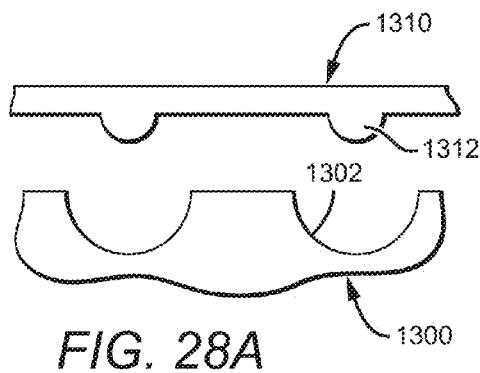
FIGS. 28A-28G show various stages of a method for forming a package according to another embodiment of the present invention.
Figure 28B:
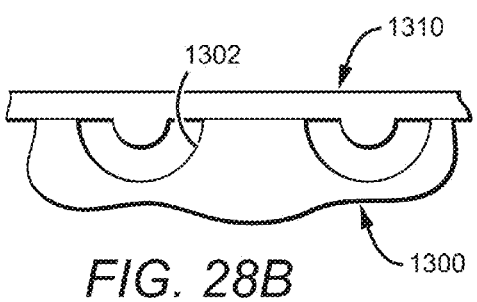
Figure 28C:
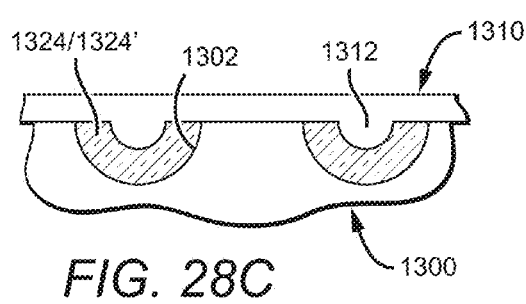
Figure 28D:
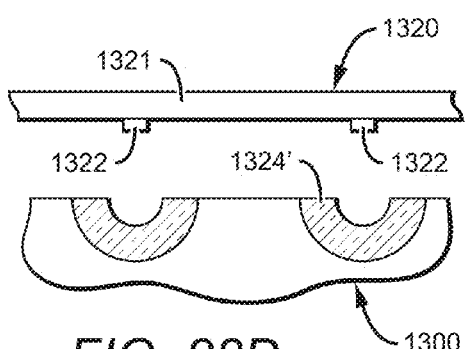
Figure 28E:
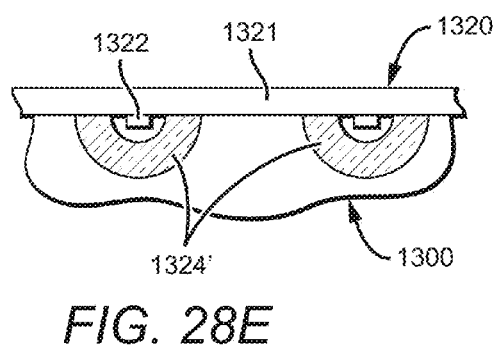
Figure 28F:
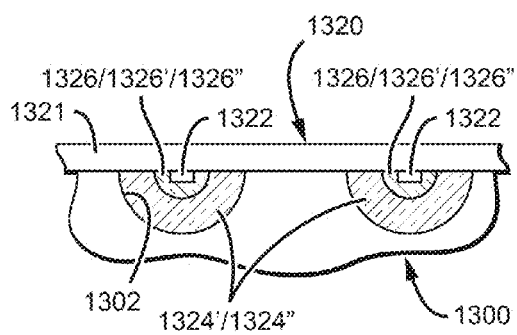
Figure 28G:
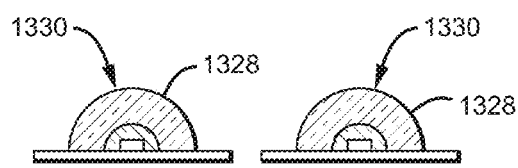

While the method described above with regard to FIGS. 27A-27G can include the steps of pressing the protrusions 1212 into the material 1224 and pressing the emitters 1222 into the material 1226, other embodiments are possible. For example, the optical element 1228 that comprises the materials 1224",1226" can be formed using an injection molding method. FIGS. 28A-28G show possible steps of one such method. In an injection molding method, the material to form sections of the encapsulant can be injected into the mold after the placement of an embossing plate protrusion or an emitter. For example, as seen in FIGS. 28B and 28C, the embossing plate 1310 can be placed such that protrusions 1312 are within molding cavities 1302 (shown in FIG. 28B) before material 1324 is injected into the mold cavity 1302 (shown in FIG. 28C). Similarly, the wafer 1320 can be placed such that the emitters 1322 are within the empty section of the mold cavity 1302 before material 1326 is injected into this empty area, as shown in FIGS. 28E and 28F. Combinations of the methods shown in FIGS. 27A-27G and 28A-28G are possible. For example, a first material can be placed in a mold cavity before the placement of an embossing protrusion, while later in the process the source is placed in the cavity before the second material is injected. Many different embodiments are possible.

While the method shown in FIGS. 28A-28G can involve the use of a single type of mold cavity and an embossing plate, other embodiments can use, for example, mold cavities of different radii and/or can be performed right-side-up, such as by injection molding or overmolding. For example, a mold cavity with a smaller volume can be placed over a source and material for an inner portion injected into the cavity and partially cured. The small-volume mold can then be removed and a mold cavity with a larger volume can be placed over the partially cured inner portion, and material can be injected to form an outer portion of an optical element. As discussed above, the inner and outer portions can contain many different materials; for example, an inner portion can contain silicone while an outer portion contains silicone and phosphor.

While the methods shown in FIGS. 27A-28G show methods of forming packages including emitters, it is understood that these methods can be easily adapted for the manufacture of optical elements that are not part of a package. For instance, a wafer with emitters need not be placed such that the emitters are within the mold cavity; instead, the material within the mold cavity can simply be cured and the optical element removed from the mold. The optical element can subsequently be attached by an adhesive epoxy, for example.

Figure 29:
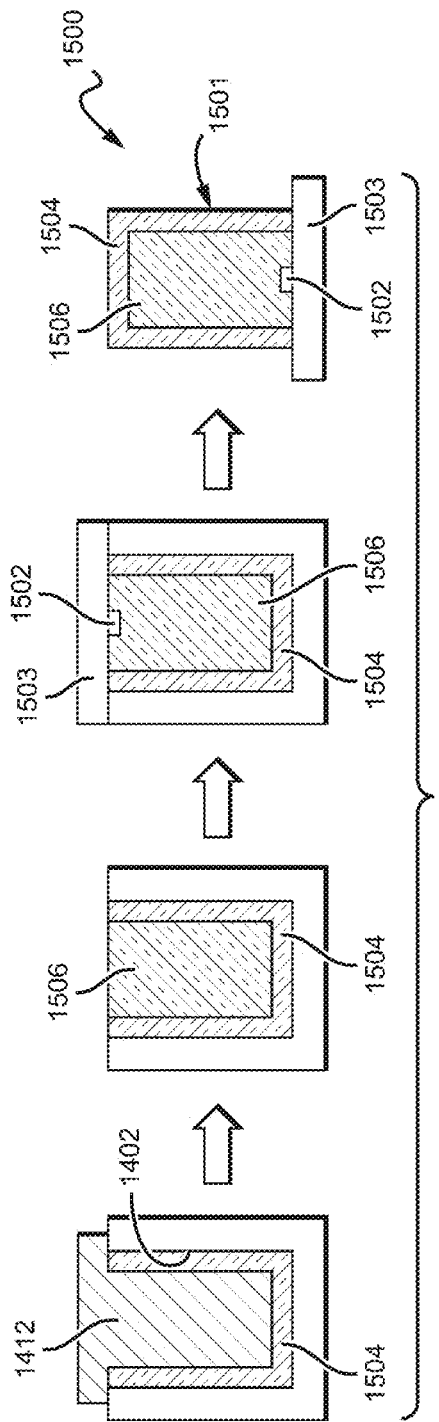
FIG. 29 shows various stages of a method for forming a package according to yet another embodiment of the present invention.

While the above embodiments show hemispheric optical elements, many different shapes of the optical element and combinations of segment shapes are possible, and the methods shown in FIGS. 27A-27G and 28A-28G can be adapted for such elements. The methods described in FIGS. 27A-28G can be adapted for use with any of the embodiments described below. For example, FIG. 29 shows some stages of formation for a cylindrical or rectangular prismatic optical element 1501, such as by using a mold cavity 1402 and/or embossing protrusion 1412 with a cylindrical or rectangular prismatic shape. While FIGS. 29-34 show the formation of a single optical element and package, other embodiments where multiple optical elements and/or packages are formed are possible and can be adapted by one of skill in the art based on FIGS. 27A-28G above. For example, instead of a source 1502 on a substrate 1503, multiple sources on a substrate wafer can be used with a mold having multiple cavities and an embossing plate having multiple protrusions.

The optical element 1501 can include an outer portion 1504 and an inner portion 1506. In this embodiment, the outer portion 1504 can cover the outside and top surfaces of the inner portion 1506, although other embodiments are possible. In a first stage of FIG. 29, the outer material 1504 can be placed into the mold cavity 1402, and the embossing plate protrusion 1412 can be placed into the outer material; alternatively, the outer material 1504 can be injected around the embossing plate protrusion 1412. The protrusion 1412 can have a height less than that of the mold cavity 1402 to allow the first material to form a top of the eventual optical element. Next, the outer material 1504 can be partially cured, the protrusion 1412 can be removed, and the inner material 1506 can be placed in the remaining section of the mold cavity 1402 unoccupied by the outer material 1504. Next, a source 1502 on a substrate 1503 can be placed into the inner material 1506; alternatively, the inner material 1506 can be injected and surround the source 1502. The inner material 1506 can then be cured, and/or the curing of the outer material 1504 can be finished, and the package 1500 removed from the mold cavity. This general process can be followed to form the packages 1510,1520,1530 shown below in FIGS. 30-32.

Figure 30:
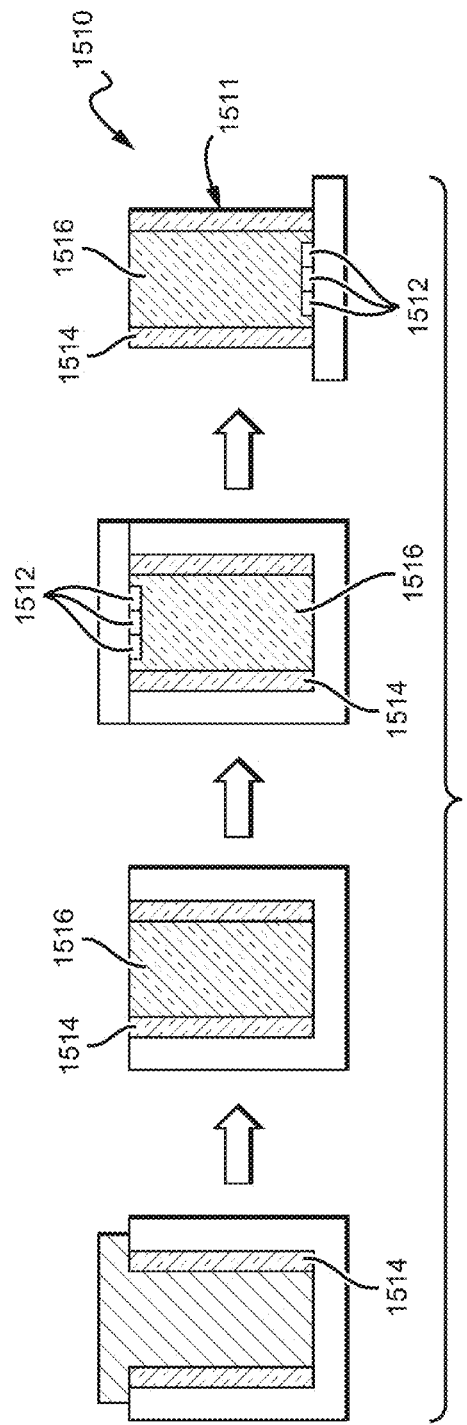
FIG. 30 shows various stages of a method for forming a package according to yet another embodiment of the present invention.

FIG. 30 shows stages of formation for a cylindrical or rectangular prismatic optical element 1511. Unlike the optical element 1501 shown in FIG. 29, the optical element 1511 can have an outer portion 1514 which is only on the side surface(s) of the inner portion 1516. To form such an optical element, the embossing protrusion can have a height approximately equal to the height of the molding cavity. This method can be helpful to form optical elements that serve as mixing chambers and where light can escape from the top of the optical element. Some such embodiments are described in U.S. patent application Ser. No. 13/902,080 to Lowes et al. and entitled "Emitter Package with Integrated Mixing Chamber." In practice, a small layer of the outer portion 1514 may form on the bottom of the molding cavity during fabrication, and thus on top of the inner portion 1516 after the optical element is fully formed. If this occurs, this layer can be polished off.

Figure 31:
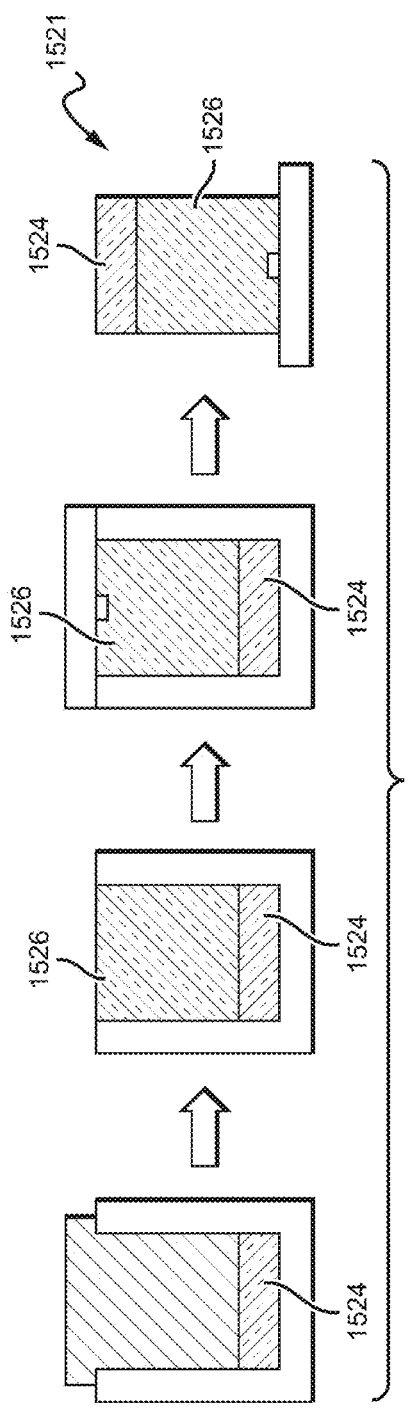
FIG. 31 shows various stages of a method for forming a package according to yet another embodiment of the present invention.

Upper and lower portions (as opposed to inner and outer portions) are also possible. FIG. 31 shows stages of formation for a cylindrical or rectangular prismatic optical element 1521, which includes an upper portion 1524 and a lower portion 1526. Non-rectangular cross-section shapes can also have upper and lower portions.

Figure 32:
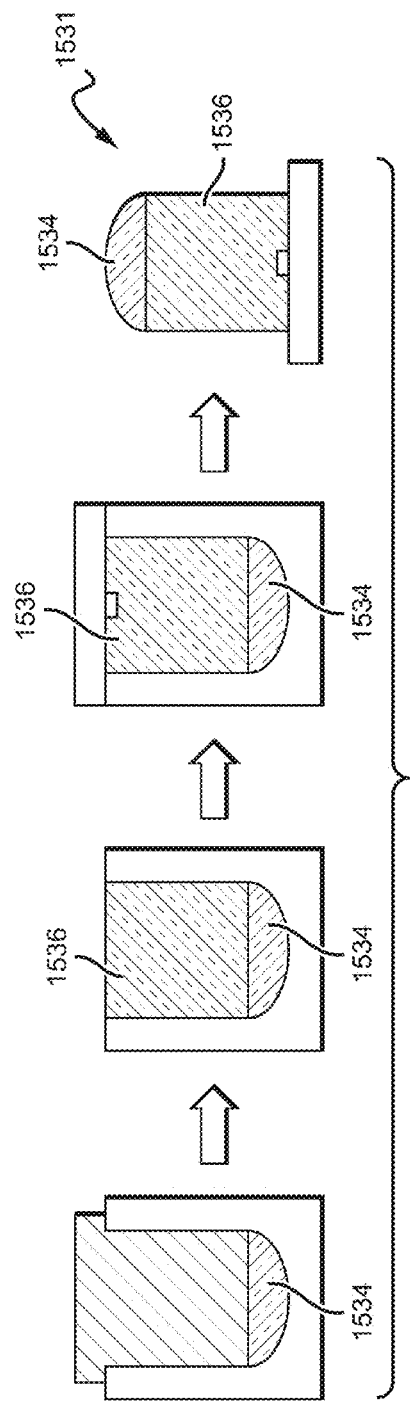
FIG. 32 shows various stages of a method for forming a package according to yet another embodiment of the present invention.
Figure 33A:
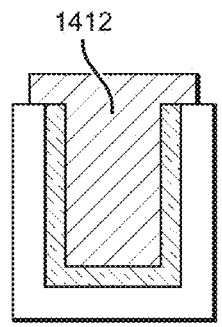
FIGS. 33A-33F show various stages of a method for forming a package according to yet another embodiment of the present invention.
Figure 33B:
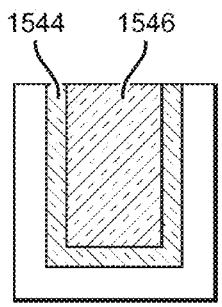
Figure 33C:
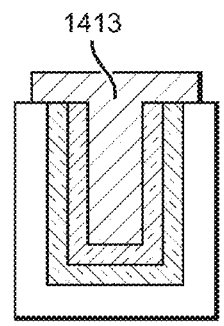
Figure 33D:
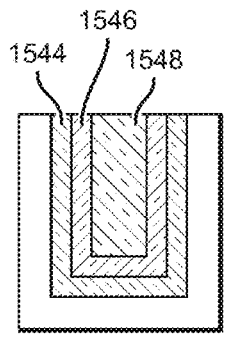
Figure 33E:
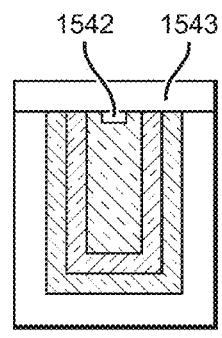
Figure 33F:
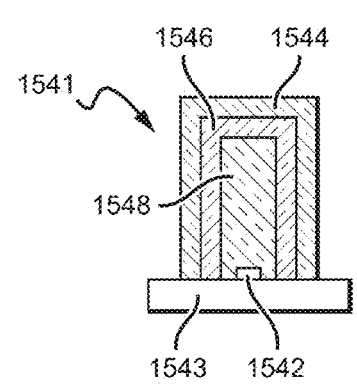

While the above embodiments specifically show hemispheric optical elements or optical elements having a rectangular cross-section, many different shapes are possible. For example, FIG. 32 shows an optical element 1531 having a composite shape, with a lower portion 1536 having a rectangular cross-section and a top portion 1534 having a frustocircular cross-section (such as a frustospherical or frustocylindrical shape). Many other shapes are possible.

While the above embodiments specifically show optical elements having only 2 portions, optical elements according to the present invention can have any number of portions. For example, FIGS. 33A-33F show the stages of formation for an optical element 1541 having an outer portion 1544, a middle portion 1546, and an inner portion 1548. In all of the embodiments described herein, different portions can be formed using different embossing protrusions. For example, in FIGS. 33A-33F, the outer portion 1544 can be formed by or around the protrusion 1412, while the middle portion 1546 can be formed by or around the protrusion 1413, which can have a smaller cross-section or volume than the protrusion 1412. The protrusions 1412,1413 can be on the same or different embossing plates. The inner portion 1548 can be formed around a source 1542 on a substrate 1543 in any of the manners described above.

Different portions of optical elements according to the present invention can be fabricated using embossing protrusions of different sizes. Alternatively the fabrication process can be altered such that a smaller portion of an embossing protrusion is used for each successive optical element portion.

Figure 34:
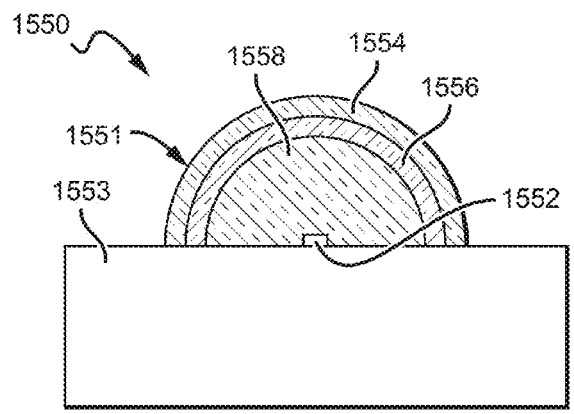
FIG. 34 is a cross-sectional view of a package according to yet another embodiment of the present invention.

As previously described, the portions 1544,1546,1548 can be cured in a manner so as to form a chemical bond at the interfaces between portions. For example, the outer portion 1544 can only be partially cured when the middle portion 1546 begins curing, such as in FIG. 33C. Similarly, the middle portion 1546 can only be partially cured when the inner portion 1548 begins curing, such as in FIG. 33E. When the inner portion 1548 begins curing, the outer portion 1544 can be partially cured or completely cured, since there may not be an interface between these portions and no chemical bond between the portions 1544,1548 may be necessary. FIG. 34 shows a package 1550 which can have a hemispheric optical element 1551 having three portions 1554,1556,1558 and a source 1552 on a substrate 1553, which can manufactured in a similar manner. Many different shapes beyond those shown in FIGS. 33A-33F and 34 having optical elements with three or more portions are possible.

Portions of optical elements according to the present invention can be any thickness, and can have uniform or non-uniform thickness (e.g., the top portion 1534 from FIG. 32). In one embodiment, the thicknesses of the layers can be 50 μm or larger, or approximately 50 μm to approximately 10 mm, although other smaller and larger embodiments are possible. In one embodiment, the thicknesses of layers are approximately 100 μm to approximately 2 mm. In another embodiment, the thicknesses of layers are approximately 400 μm to approximately 1 mm. In one embodiment, a phosphor portion having a thickness of about 400 μm surrounds a silicone portion having a thickness of about 1 mm. Many different thicknesses are possible.

While many of the embodiments described above refer to portions having a wavelength conversion material, any type of material can be used in different portions of embodiments of the present invention. For example, any one of the portions described above in FIGS. 27A-34 and other embodiments of the present invention can comprise scattering particles, and/or different regions can comprise different concentrations of phosphor particles or scattering particles. For example, some embodiments including any of the above embodiments can have an outer portion with scattering particles; for example, in FIG. 30, the package 1510 can include an outer portion 1514 having scattering particles. These scattering particles can be effective for color mixing, particularly in packages such as the package 1510 having multiple sources, such as the sources 1512, which combined can emit two or more colors of light. Examples of such source arrangements include but are not limited to RGB, RGBA, and RGBW emitter configurations. Multisource arrangements, and particularly multi-source arrangements used in combination with scattering particles and/or mixing chambers such as integrated mixing chambers, are described in detail in U.S. patent application Ser. No. 13/902,080 to Lowes et al. and entitled "Emitter Package with Integrated Mixing Chamber." These benefits can be realized in other embodiments of the present invention having a scattering particle portion outside a phosphor portion.

Another embodiment that can utilize scattering particles can also include phosphor particles in one or more portions. Some embodiments can include a scattering particle portion to the outside of a phosphor particle portion. For example, in the package 1540 shown in FIGS. 33A-33F, the middle portion 1546 can include phosphor particles. The phosphor particles can be separated from and/or thermally coupled to the source 1542, as described previously, in order to gain the benefits of having a remote phosphor. The middle portion 1546 can be thermally coupled to the source 1542 by the inner portion 1548, which can be transparent and/or thermally conductive, and can be similar to the filler portions previously described herein. The outer portion 1548 can comprise scattering particles. After light from the source 1542 passes through the middle portion 1546, both converted and unconverted light (for example, yellow and blue light, respectively) can be present. An outer portion 1544 comprising scattering particles can further mix these wavelengths. These benefits can be realized in other embodiments with a scattering particle portion outside a phosphor portion.

Some embodiments of the present invention can include multiple phosphor layers which can be arranged to eliminate, minimize, or reduce reabsorption of light, which reduces efficacy. For example, a red phosphor can sometimes absorb yellow light. Thus, a layer having a yellow phosphor dispersed therein can be placed on the outside of a red phosphor layer, which can reduce or eliminate reabsorption of yellow light by red phosphor. For example, in FIG. 34, the inner portion 1558 can comprise silicone, the middle portion 1556 can comprise a red phosphor, and the outer portion 1554 can comprise a yellow phosphor. In another similar embodiment, another layer comprising cyan phosphor can be the outermost portion. Because red and yellow phosphor can absorb blue light and cyan has a wavelength similar to blue light, the cyan phosphor can be placed outside the red and yellow phosphors, which can reduce or eliminate reabsorption of the cyan light by the red and/or yellow phosphors. Many different phosphor portion orders are possible, and the above is only exemplary. Embodiments of the present invention can include less than all of the above layers.

In yet another embodiment of the present invention, optical element layers can be used to smooth the index of refraction transitions between layers. For example, in a prior art package having a source and an encapsulant, light can experience a jump from an index of refraction of 1.5 (the encapsulant) to an index of refraction of about 1.0 (air), causing losses. Smoothing the transition between a high index of refraction, such as 1.5, and a low index of refraction, such as 1.0, can reduce losses. One manner in which the transition can be smoothed is by designing successive layers to have lower indices of refraction which are lower than the previous layer, and thus closer to that of air. For example, in FIG. 34, the inner portion 1558 can have an index of refraction of about 1.5, the middle portion 1556 can have an index of refraction of about 1.3, and the outer portion 1554 can have an index of refraction of about 1.1. Other embodiments including any of the embodiments described above can have layers with successively lower indices of refraction. In other embodiments, successive layers of material can have indices of refraction that are the same or similar to one another.

In yet another embodiment of the present invention, layers can be fabricated to serve as TIR or Fresnel lenses. For example, in FIG. 30 the outer portion 1514 can be designed to have an index of refraction dissimilar to the index of refraction of the inner portion 1516, causing light to be reflected internally. In such an embodiment the optical element 1511 can serve as an integrated mixing chamber.

The above embodiments are only a few embodiments of optical elements and/or packages according to the present invention, and are in no way intended to be limiting. Different elements can be substituted into other embodiments; for example, while FIG. 30 is shown with multiple sources, a single source can be used; similarly, embodiments shown with a single source can have multiple sources. Some other optics which can be formed using the above methods are described in the following commonly assigned applications, each of which is fully incorporated by reference herein in its entirety: U.S. patent application Ser. No. 12/498,253 to Le Toquin and entitled "LED Packages with Scattering Particle Regions"; U.S. patent application Ser. No. 13/306,589 to Tarsa et al. and entitled "Complex Primary Optics and Methods of Fabrication"; U.S. patent application Ser. No. 13/544,662 to Tarsa et al. and entitled "Primary Optic for Beam Shaping"; U.S. patent application Ser. No. 13/770,389 to Lowes et al. and entitled "LED Package with Multiple Element Light Source and Encapsulant having Planar Surfaces"; U.S. patent application Ser. No. 13/804,309 to Castillo et al. and entitled "LED Dome with Improved Color Spatial Uniformity"; U.S. patent application Ser. No. 13/842,307 to Ibbetson et al. and entitled "Low Profile Lighting Module".

Although the present invention has been described in detail with reference to certain preferred configurations thereof, other versions are possible. Further, while elements of the above embodiments are described in combination with other elements, the benefits associated with a single element do not require the presence of any other element unless so stated. Therefore, the spirit and scope of the invention should not be limited to the versions described above.

We claim:

1. A light emitting device, comprising:
a light source; and
a wavelength conversion element comprising a filler portion and a phosphor portion on said filler portion, said phosphor portion comprising a wavelength conversion material;
wherein said phosphor portion is remote to said light source; and
wherein said phosphor portion is thermally coupled to said light source;
wherein said light source and said wavelength conversion element are on a heat sink,
wherein said phosphor portion is separated from said light source by at least about 0.5 mm.

2. The light emitting device of claim 1, wherein said filler portion thermally couples said phosphor portion to said light source.

3. The light emitting device of claim 1, wherein said filler portion is configured to dissipate heat from said phosphor portion conductively and convectively.

4. The light emitting device of claim 1, wherein said filler portion comprises glass.

5. The light emitting device of claim 4, wherein said glass has a melting temperature of approximately 300° C. or below.

6. The light emitting device of claim 1, wherein said filler portion and said phosphor portion have approximately equal indices of refraction.

7. The light emitting device of claim 1, wherein said filler portion comprises a solid phase material.

8. The light emitting device of claim 1, wherein said filler portion comprises a liquid.

9. The light emitting device of claim 1, wherein said light emitting device is configured such that said filler material is a solid phase material during periods of non-operation and a liquid material during periods of operation.

10. The light emitting device of claim 1, wherein said wavelength conversion element has a width larger than a width of said source.

11. The lighting emitting device of claim 1, wherein said wavelength conversion element comprises scattering particles.

12. The lighting emitting device of claim 1, wherein said filler portion comprises scattering particles.

13. A wavelength conversion component, said component comprising:
    an outer portion comprising a wavelength conversion material; and
    an inner portion comprising a substantially transparent and thermally conductive material;
    wherein said component is substantially solid;
    wherein said outer portion and said inner portion comprise a binder.

14. The component of claim 13, wherein said binder is silicone.

15. The component of claim 13, wherein said component is substantially frustospherical.

16. The component of claim 13, wherein said inner portion is liquid.

17. The component of claim 13, wherein said inner portion has a minimum width of at least 0.1 mm.

18. An optical device, comprising:
    an optical element, said optical element comprising:
        a molded outer portion comprising a wavelength conversion material; and
        a molded inner portion on and distinct from said molded outer portion;
        wherein said inner portion has a higher index of refraction than said outer portion.

19. The optical device of claim 18, further comprising a source;
    wherein said optical element is overmolded onto said source.

20. The optical device of claim 18, wherein said outer and inner portions have different compositions.

21. The optical device of claim 18, wherein said optical element further comprises a molded innermost portion on and distinct from said molded inner portion.

22. The optical device of claim 21, wherein said outer portion comprises a first phosphor and said inner portion comprises a second phosphor.

23. The optical device of claim 21, wherein said innermost portion has a higher index of refraction than said inner portion and said inner portion has a higher index of refraction than said outer portion.

24. The optical device of claim 21, wherein said molded outer portion is integral with said molded inner portion.

* * * * *